(12) United States Patent
Mori et al.

(10) Patent No.: US 7,667,299 B2
(45) Date of Patent: Feb. 23, 2010

(54) CIRCUIT BOARD AND METHOD FOR MOUNTING CHIP COMPONENT

(75) Inventors: Masato Mori, Osaka (JP); Masato Hirano, Osaka (JP); Hiroaki Onishi, Osaka (JP); Kiyoshi Nakanishi, Kanagawa (JP); Akihiko Odani, Kanagawa (JP)

(73) Assignee: Panasonic Corporation, Osaka (JP)

( * ) Notice: Subject to any disclaimer, the term of this patent is extended or adjusted under 35 U.S.C. 154(b) by 365 days.

(21) Appl. No.: 10/587,280

(22) PCT Filed: Jan. 25, 2005

(86) PCT No.: PCT/JP2005/000890

§ 371 (c)(1),
(2), (4) Date: Jul. 25, 2006

(87) PCT Pub. No.: WO2005/072033

PCT Pub. Date: Aug. 4, 2005

(65) Prior Publication Data

US 2007/0145575 A1    Jun. 28, 2007

(30) Foreign Application Priority Data

Jan. 27, 2004  (JP) ............................. 2004-017899
Feb. 17, 2004  (JP) ............................. 2004-039427

(51) Int. Cl.
H01L 29/06  (2006.01)

(52) U.S. Cl. ................. 257/623; 257/19; 257/E25.006; 257/E25.013

(58) Field of Classification Search .................. 257/686, 257/E25.006, 623
See application file for complete search history.

(56) References Cited

U.S. PATENT DOCUMENTS 6,779,710 B2   8/2004  Igarashi et al.
6,888,750 B2 *  5/2005  Walker et al. .......... 365/185.05
6,933,613 B2 *  8/2005  Akashi ........................ 257/778
2001/0054751 A1 * 12/2001  Toyosawa .................... 257/668

FOREIGN PATENT DOCUMENTS

| CN | 1384699 | 12/2002 |
|---|---|---|
| EP | 1 168 445 | 1/2002 |
| JP | 58-111946 | 7/1983 |
| JP | 60-176569 | 11/1985 |
| JP | 61-263191 | 11/1986 |
| JP | 63-60593 | 3/1988 |
| JP | 1-191491 | 8/1989 |
| JP | 4-30590 | 2/1992 |
| JP | 6-251993 | 9/1994 |

(Continued)

OTHER PUBLICATIONS

Chinese Office Action issued Mar. 27, 2009 in connection with CN 200580003094.7 corresponding to the present U.S. patent application.

*Primary Examiner*—Thao X Le
*Assistant Examiner*—Ajay K Arora
(74) *Attorney, Agent, or Firm*—Wenderoth, Lind & Ponack L.L.P.

(57) ABSTRACT

A circuit board includes a substrate including electrode patterns formed thereon, first chip components mounted on the substrate and a second chip component mounted on a side of electrodes of the first chip components opposite from the substrate. The second chip component is bonded at one electrode to an electrode of the first chip component and is also bonded at the other electrode to an electrode of the first chip component. By stacking chip components in plural stages, it is possible to mount chip components with a high density on the substrate, thereby enabling reduction of the size of the circuit board.

4 Claims, 38 Drawing Sheets

FOREIGN PATENT DOCUMENTS

| | | |
|---|---|---|
| JP | 6-268365 | 9/1994 |
| JP | 7-106732 | 4/1995 |
| JP | 8-124967 | 5/1996 |
| JP | 8-228066 | 9/1996 |
| JP | 10-84011 | 3/1998 |
| JP | 2001-196792 | 7/2001 |
| JP | 2001-223455 | 8/2001 |
| JP | 2002-57434 | 2/2002 |
| JP | 2002-329956 | 11/2002 |
| JP | 2003-108963 | 4/2003 |
| JP | 2003-218150 | 7/2003 |
| WO | 01/48821 | 7/2001 |

\* cited by examiner

CIRCUIT BOARD AND METHOD FOR MOUNTING CHIP COMPONENT

TECHNICAL FIELD

The present invention relates to a circuit board including chip components as electronic components mounted thereon, which correspond to a chip component package and a chip component assembly, and also relates to a method for mounting chip components.

BACKGROUND ART

In recent years, along with the reduction of the sizes and the thicknesses, and the increase of functions of electronic apparatuses such as cellular phones and computers, there has been increasingly a need for mounting with higher densities in a circuit board electronic components on the circuit board including electrode patterns formed thereon. To cope therewith, in the field of mounting chip components which are fine electronic components for use in surface mounting, the reduction of component sizes and the reduction of pitches between mounted components have been advanced. Further, in order to substantially eliminate the intervals between chip components, electronic components constituted by plural chip components connected to one another are commercially available. Further, there has been suggested stacking of plural large circuit boards with chip components interposed therebetween for realizing high-density mounting.

For example, JP-A No. 6-251993 describes an electronic-component assembly constituted by plural chip components each having a plate shape and having cutouts formed at its four corners and electrodes at its opposite end surfaces, wherein the plural chip components are connected and bonded to one another at their side surfaces on which no electrodes are formed. Further, JP-A No. 2001-223455 describes a technique for fabricating an electric component assembly constituted by two or more chip components having a rectangular-parallelepiped shape and including electrodes at their opposite ends which are stacked in a direction perpendicular to the longitudinal directions of the chip components with an insulation layer interposed therebetween and then mounting the electronic component assembly onto a board including electrode patterns formed thereon. Further, JP-A No. 63-60593 discloses two same-sized chip condensers stacked perpendicularly to the main surface of a board.

Further, FIG. 7 in Pamphlet of International Publication No. 01/048821 and FIG. 20 in a JP-A No. 2003-108963 describe a substrate structure constituted by a first substrate, a second substrate which is electrically connected onto the first substrate through chip components such as resistors and condensers, and other electronic components mounted on the upper and lower main surfaces of the second substrate. In the structure described in Pamphlet of International Publication No. 01/048821 and JP-A No. 2003-108963, chip components between the first substrate and the second substrate are provided instead of conductors for connecting both the substrates to each other, while the other electric components which do not contribute to the electrical connection between the first and second substrates occupy a greater part of the region between these substrates.

On the other hand, in the field of chip-component mounting, along with the reduction of component sizes and the reduction of pitches between mounted components, there has been a need for finer and higher-accuracy mounting, but it is difficult to realize higher-density mounting due to the increase of mounting failures such as missing parts and shorts. Namely, in the field of chip-component mounting, the increase of the densities of mounting by the reduction of component sizes and the reduction of pitches between components has reached a limit. On the other hand, the total thickness of a circuit board after mounting is restricted by packaged components having greater heights than those of chip components, and accordingly, even when fine chip components are mounted thereon at small intervals, there is left a space above the chip components, thus wastefully using spaces for mounting electronic components including chip components.

Further, the technique disclosed in JP-A No. 63-60593 is merely stacking the same type of chip condensers vertically and can be replaced by the use of a single chip condenser with an equivalent capacitance without stacking chip condensers. Further, a limited region of a circuit board can be used for stacking chip condensers due to the restriction on their capacitances and the like, and therefore, such stacking of chip condensers does not significantly contribute to the reduction of the size of the circuit board.

Further, the substrate structure disclosed in Pamphlet of International Publication No. 01/048821 and JP-A No. 2003-108963 can realize high-density mounting with multiple layers, but such high-density mounting requires significant changes in the design of the circuit board. Thereby, such a substrate structure cannot address the requirements for locally and easily mounting chip components with high densities.

SUMMARY OF THE INVENTION

The present invention was made in order to overcome the aforementioned problems and aims at providing a circuit board and a chip-component mounting method which enable effectively utilizing the space usable for mounting electronic components to realize higher-density mounting of chip components and size reduction.

A circuit board according to a first aspect of the present invention is a circuit board including chip components mounted thereon and the circuit board comprises:

a substrate including electrode patterns formed thereon;

plural first chip components which are included in said chip components and mounted through a conductive bonding material on said substrate; and a second chip component which is included in said chip components and mounted through a conductive bonding material on a side of said plural first chip components opposite from said substrate;

wherein one first chip component and the other first chip component included in said plural first chip components have substantially a same height on said substrate, and said second chip component is bonded at one electrode to an electrode of said one first chip component and is bonded at the other electrode to an electrode of said other first chip component.

In the aforementioned first aspect, the following structures may be employed. The aforementioned plural first chip components and the aforementioned second chip component may have lengths of 2 mm or less. The aforementioned plural first chip components and the aforementioned second chip component may be resistors, condensers or inductors. Further, the circuit board may include a reinforcing resin configured to cover the junctions between the aforementioned plural first chip components and the aforementioned second chip component on the aforementioned substrate.

A circuit board according to a second aspect of the present invention is a circuit board including chip components mounted thereon and the circuit board comprises:

a substrate including electrode patterns formed thereon;

a first chip component which is included in said chip components and mounted through a conductive bonding material on said substrate; and a second chip component which is included in said chip components and mounted through a conductive bonding material on a side of said first chip components opposite from said substrate;

wherein a first chip component included in said first chip components is a component of a different type from the second chip component bonded to an electrode of said first chip component.

A chip-component mounting method according to a third aspect of the present invention is a chip-component mounting method for mounting chip components onto a substrate including electrode patterns formed thereon, a second chip component being included in said chip components, and plural first chip components having substantially a same height on said substrate and being included in said chip components and placed on said electrode patterns through a conductive bonding material, wherein, in placing said second chip component on said first chip components at an opposite side from said substrate, one of the electrodes of said second component is placed through a conductive bonding material on an electrode of one first chip component included in said first chip components while the other electrode of said second component is placed through a conductive bonding material on an electrode of another first chip component included in said first chip components, so that the components are mounted.

In the aforementioned third aspect, the following structures may be employed.

In mounting the aforementioned second chip component to the aforementioned first chip components through the aforementioned bonding material after mounting the aforementioned first chip components to the aforementioned electrode patterns through the aforementioned bonding material, only a partial region on the aforementioned substrate which includes the aforementioned second chip component may be heated for securing it. Also, the mounting of the aforementioned first chip components to the aforementioned electrode patterns through the aforementioned bonding material and the mounting of the aforementioned second chip component to the aforementioned first chip components through the aforementioned bonding material may be performed through a single process. Also, after mounting the aforementioned second chip component to the aforementioned first chip components through the aforementioned bonding material to complete the formation of chip-component structure, the aforementioned electrodes of the aforementioned first chip components included in the aforementioned chip-component structure may be brought into contact with the aforementioned electrode patterns, and the aforementioned chip-component structure may be secured to the aforementioned substrate through the aforementioned bonding material. Also, in mounting the aforementioned second chip component to the aforementioned first chip components through the aforementioned bonding material, the aforementioned respective plural first chip components may be held in concave portions of a holding member. Also, the aforementioned bonding material between the aforementioned plural first chip components and the aforementioned second chip component may be a solder layer formed on the electrodes of the aforementioned plural first chip components or a solder layer formed on the electrodes of the aforementioned second chip component. Further, the methods may include the step of covering the junctions between the aforementioned plural first chip components and the aforementioned second chip component with a reinforcing resin, on the aforementioned substrate.

A circuit board according to a fourth aspect of the present invention is a circuit board including chip components mounted thereon and the circuit board comprises:

a substrate including electrode patterns formed thereon;

plural first chip components which are included in said chip components and mounted through a conductive bonding material on said substrate;

a secondary substrate mounted on a side of said plural first chip components opposite from said substrate through a conductive bonding material; and a second chip component included in said chip components which is mounted through a conductive bonding material on a side of said secondary substrate opposite from said plural first chip components and is electrically connected to said plural first chip components through said secondary substrate;

wherein said plural first chip components have substantially a same height on said substrate, and only said plural first chip components exist as electronic components between said substrate and said secondary substrate.

In the aforementioned fourth aspect, the following structures may be employed.

The aforementioned plural first chip components and the aforementioned second chip component may have lengths of 2 mm or less. Also, the aforementioned plural first chip components and the aforementioned second chip component may be resistors, condensers or inductors. Also, the number of the aforementioned plural first chip components may be two.

A chip-component mounting method according to a fifth aspect of the present invention is a chip-component mounting method for mounting chip components onto a substrate including electrode patterns formed thereon and the method comprising:

mounting and bonding electrodes of plural first chip components included in said chip components to one main surface of a secondary substrate through a conductive bonding material;

forming a formation of chip-component structure configured to connect electrically said plural first chip components to a second chip component included in said chip components by bonding an electrode of said second chip component to electrodes on the other main surface of said secondary substrate opposite from said one main surface through a conductive bonding material; and bonding electrodes of said plural first chip components in said formation of chip-component structure to the electrodes on said substrate through a conductive bonding material to mount the components;

wherein said plural first chip components have substantially a same height on said substrate, and only said plural first chip components exist as electronic components between said substrate and said secondary substrate.

A chip-component mounting method according to a sixth aspect of the present invention is a chip-component mounting method for mounting chip components onto a substrate including electrode patterns formed thereon and the method comprising:

placing plural first chip components included in said chip components on electrodes on said substrate;

placing a secondary substrate on a side of said plural first chip components opposite from said substrate to place electrodes of said plural first chip components on electrodes on one main surface of the secondary substrate;

placing an electrode of a second chip component included in said chip components, on electrodes on the other main surface of said secondary substrate opposite from said single main surface; and mounting said electrodes of said plural first chip components to said electrodes on said substrate, then mounting said electrodes on said one main surface of said secondary substrate to said electrodes of said first chip components, and then mounting said electrode of said second chip component to said electrodes on said other main surface of said secondary substrate to mount the components, through conductive bonding materials;

wherein said plural first chip components have substantially a same height on said substrate, and only said plural first chip components exist as electronic components between said substrate and said secondary substrate.

According to the present invention, chip components can be mounted on a substrate with a high density, thereby enabling reduction of the size of the circuit board. Namely, when packaged components and chip components are mounted on a substrate such that they are mixed, there is caused a space above the chip components, since the chip components have greater thicknesses than those of the packaged components. On the contrary, according to the present invention, chip components are stacked to suppress the occurrence of the above spaces and to efficiently place the chip components, which enables reduction of the size of the circuit board.

DETAILED DESCRIPTION OF THE INVENTION

Figure 1:
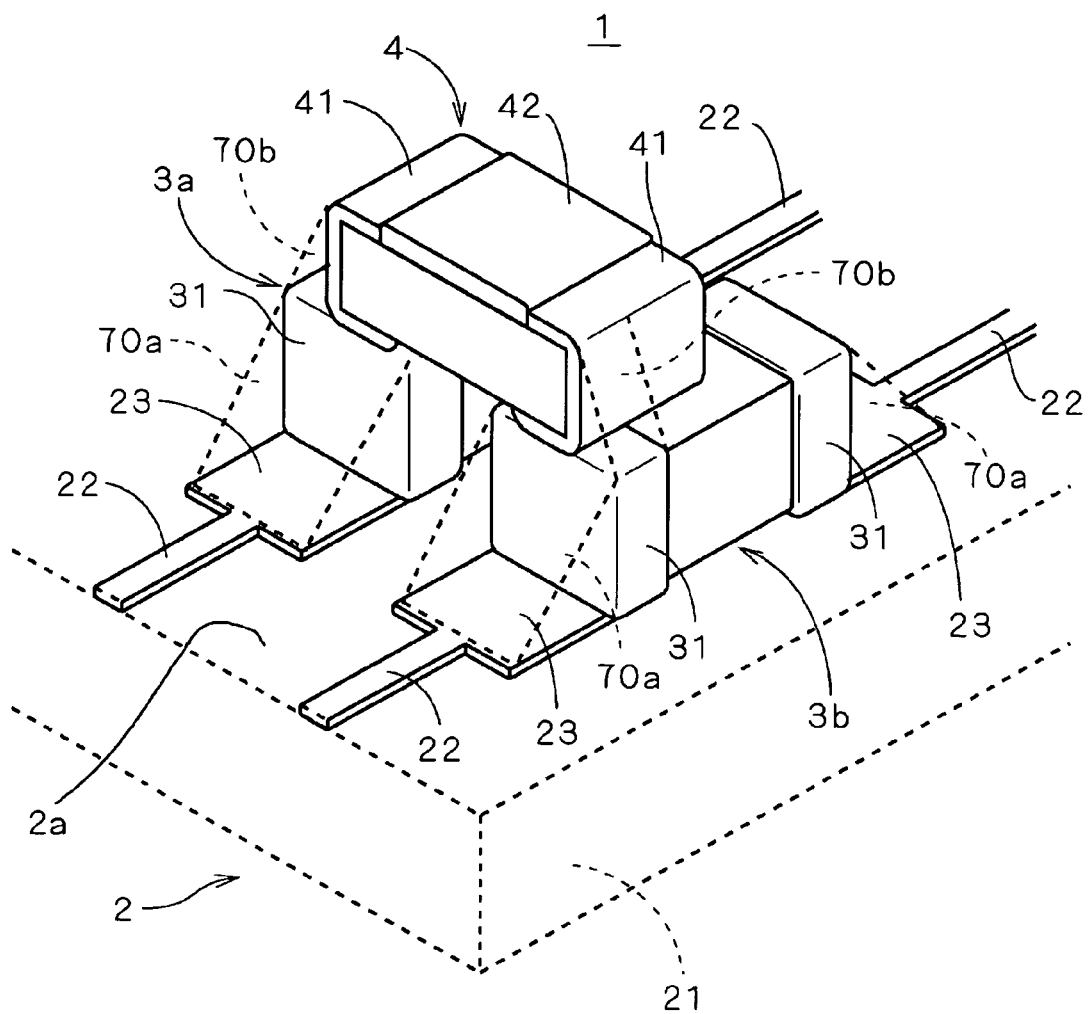
FIG. 1 is a perspective view illustrating a portion of a circuit board.

Hereinafter, embodiments of the present invention will be described with reference to the drawings. In the respective drawings, the same reference characters designate the same components.

First Embodiment

Figure 2:
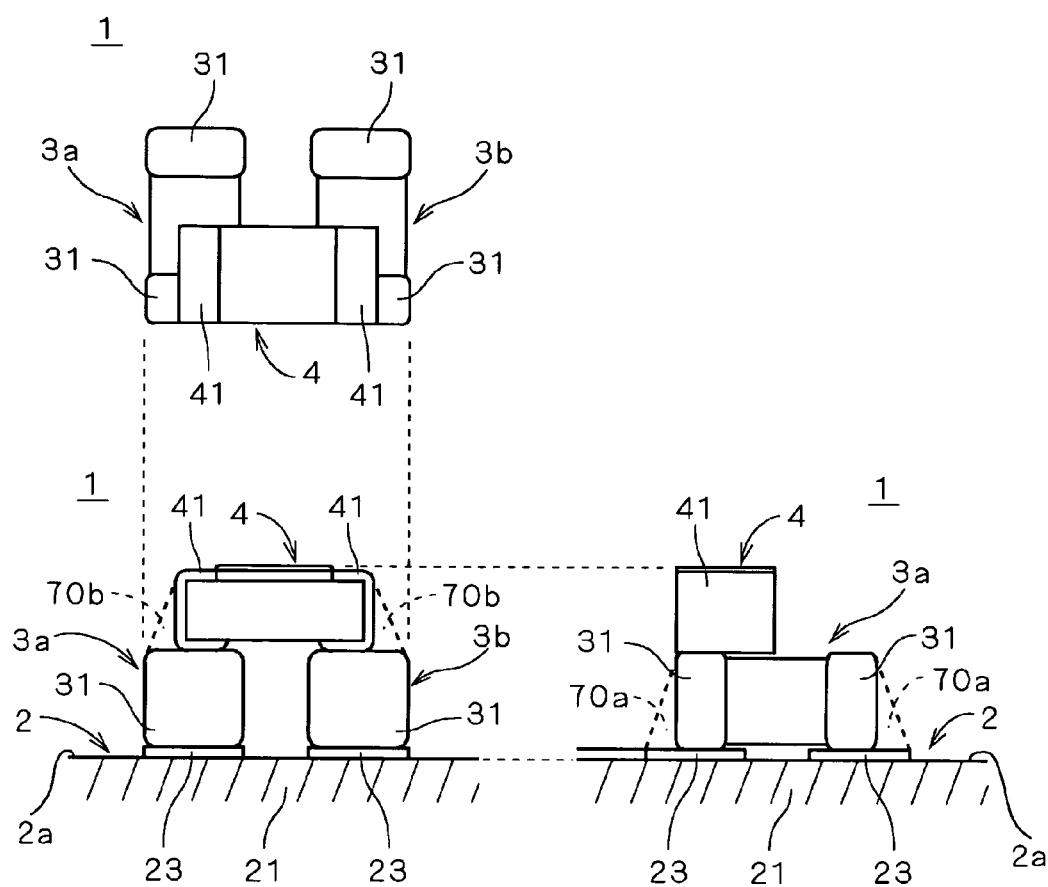
FIG. 2 is a view illustrating a structure on a circuit board.

FIG. 1 is a perspective view illustrating a portion of a circuit board 1 according to a first embodiment of the present invention. FIG. 2 is a view illustrating the structure of FIG. 1 from three directions, wherein a front view, a plan view and a side view are illustrated in the lower-left portion, the upper-left portion and the lower-right portion, respectively.

In FIGS. 1 and 2, the circuit board 1 which corresponds to a chip component assembly is illustrated as including a substrate 2, two chip components (hereinafter, referred to as "first chip components") 3a and 3b (which may be collectively referred to as first chip components 3) on the substrate 2, and a single chip component (hereinafter, referred to as "a second chip component") 4 on the first chip components 3a and 3b. The first chip components 3a and 3b and the second chip component 4 are stacked in two stages perpendicularly to a surface 2a of the substrate 2 through solders 70a and 70b, which is an exemplary bonding material, so that they are tri-dimensionally mounted thereon in a bridge shape. In FIGS. 1 and 2, the contours of the solders 70a and 70b are illustrated by broken lines for clearly illustrating the structure of the circuit board 1. In FIG. 2, the solder 70b is not illustrated in the lower-right view, the solder 70b is not illustrated in the lower-left view, and the solders 70a and 70b and the electrodes on the substrate 2 are not illustrated in the upper-left view. As will be described later, in actual, the first chip components 3a and 3b and the second chip component 4 are covered with a reinforcing resin for reinforcing the junctions.

The substrate 2 is a so-called wiring board including electrode patterns 22 formed on the surface of a substrate main body 21. Portions of the electrode patterns 22 form electrodes 23 to be bonded to electrodes of electronic components. The substrate main body 21 is formed in a plate shape or a film shape from a resin or a ceramic such as a glass epoxy resin or polyimide resin, and the electrode patterns 22 and the electrodes 23 are made of cupper.

The first chip components 3a and 3b and the second chip component 4 are so-called chip components which are contrasted with packaged components in surface mounting technologies. Further, the packaged components as aforementioned are components incorporating passive devices such as condensers and resistances and active devices such as semiconductor devices and ICs for exhibiting specific circuit functions. Further, the chip components as aforementioned are components constituted by the passive devices such as condensers and resistances and are generally electronic components having substantially rectangular-parallelepiped shapes or cylindrical shapes and including electrodes at their longitudinal opposite ends. Further, as other chip components, there are known multiple-component type (or network type) chip components constituted by a plurality of miniscule components.

In FIGS. 1 and 2, the first chip components 3a and 3b are chip condensers having substantially a rectangular-parallelepiped shape and the same size and including electrodes at their opposite ends and have a length of about 0.6 mm, a width of about 0.3 mm and a thickness (height) of about 0.3 mm, for example. Further, electrodes 31 are bonded to the electrodes 23 on the substrate 2 through the solder 70a, so that the first chip components 3a and 3b are mounted on the substrate 2 through the solder 70a.

The first chip component 3a and the first chip component 3b are arranged in parallel to each other, namely the longitudinal directions of the chip components 3a and 3b are oriented in the same direction, and also the first chip component 3a and the first chip component 3b are arranged in the direction perpendicular to their longitudinal directions. Further, the chip components 3a and 3b have substantially the same height on the substrate 2. The fact that they have substantially the same height on the substrate 2 means that they have the same heights, if the height difference between the chip components caused by fabrication errors and mounting errors therein are neglected. The interval between the first chip component 3a and the first chip component 3b is smaller than the length of the second chip component 4 and is set to about 0.2 mm.

The second chip component 4 is a component of a different type from the first chip components 3a and 3b and is a chip resistor having substantially a rectangular parallelepiped shape and including electrodes 41 at its opposite ends and a resistor 42 (see FIG. 1) between the electrodes 41. Further, the aforementioned fact that the second chip component 4 is of a different type means that the second chip component 4 has different functions from those of the first chip components 3a and 3b or has a different capacitance and the like even when it has the same functions. For example, the second chip 4 is, for example, a resistor when the first chip components 3a and 3b are, for example, condensers. The second chip component 4 has substantially the same size as that of the first chip components 3a and 3b and has a length of about 0.6 mm, a width of about 0.3 mm and a thickness (height) of about 0.25 mm, for example. The second chip component 4 is mounted through the solder 70b such that it is overlaid on the first chip components 3a and 3b, namely on the sides of the first chip components 3a and 3b opposite from the substrate 2. The second chip component 4 is bonded at one electrode 41 to an electrode 31 of the first chip component 3a through the solder 70b and also is bonded at the other electrode 41 to an electrode 31 of the first chip component 3b. This can form a structure in which the first chip components 3a and 3b and the second chip component 4 are tri-dimensionally mounted such that they are stacked through the solders 70a and 70b in two stages perpendicularly to the surface 2a of the substrate 2 in a bridge shape, namely such that the second chip component 4 straddles the first chip component 3a and the first chip component 3b adjacent to each other. Further, although not illustrated, there are also mounted, on the circuit board 1, other chip components and other packaged electronic components and the like, in addition to the first chip components 3a and 3b and the second chip component 4.

Further, the first chip components 3a and 3b are directly mounted on the substrate 2 through only the solder 70a and the second chip component 4 is directly mounted on the first chip components 3a and 3b through only the solder 70b, so that the height of the chip-component structure is substantially equal to the sum of the height of the first chip components 3a and 3b and the height of the second chip component 4, which can save the height of the chip-component structure to a minimum necessary height. Further, since only the solder is used for stacking the chip components, it is possible to prevent the increase of the fabrication cost.

Figure 3:
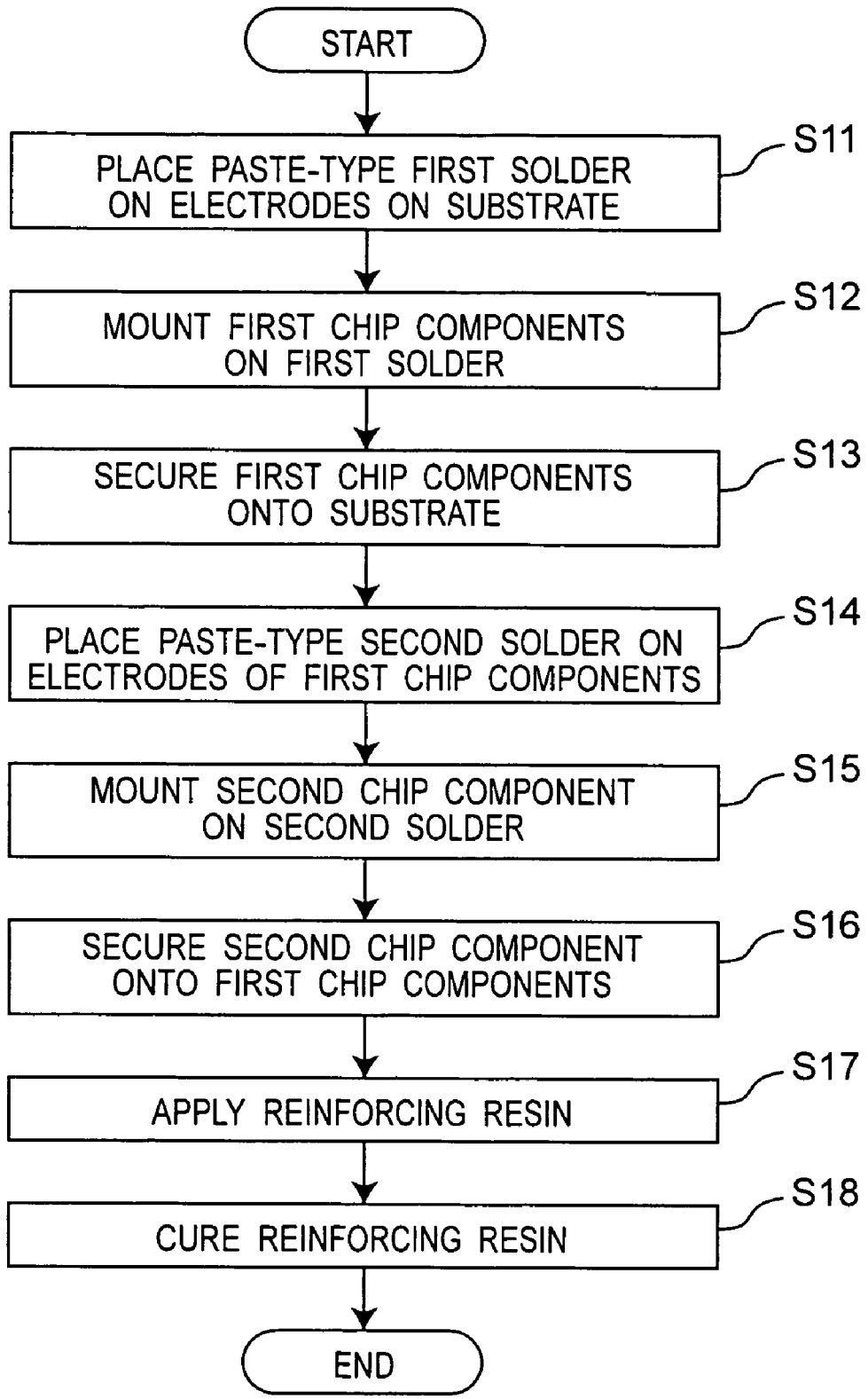
FIG. 3 is a flow chart illustrating a chip-component mounting method.
Figure 4A:
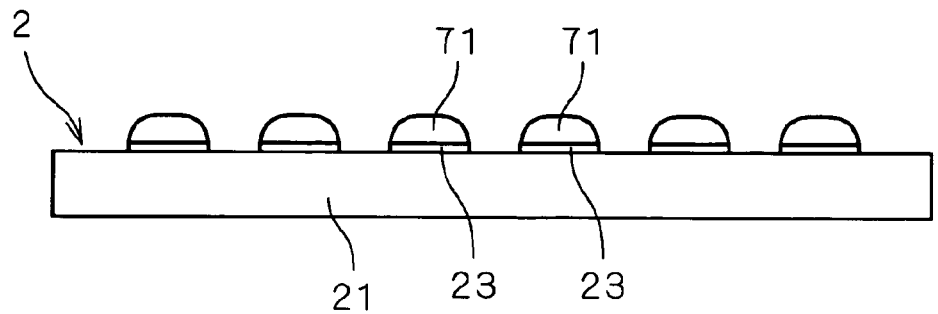
FIG. 4A is a view illustrating mounting of a first chip component.
Figure 4B:
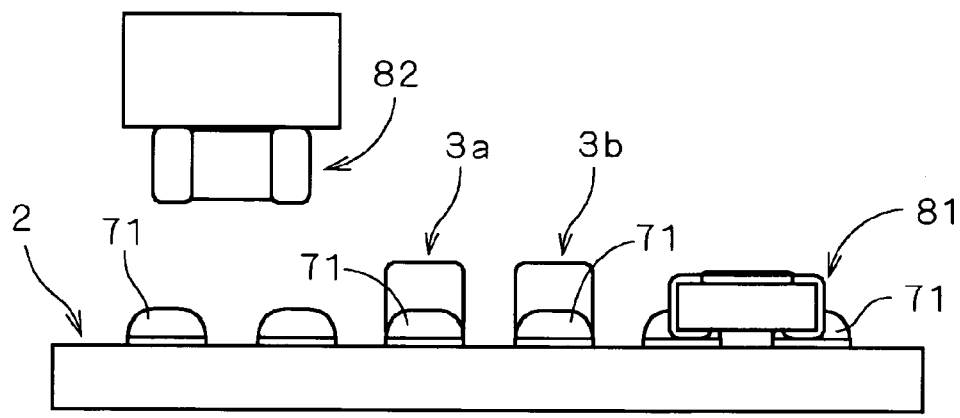
FIG. 4B is a view illustrating mounting of the first chip component.
Figure 4C:
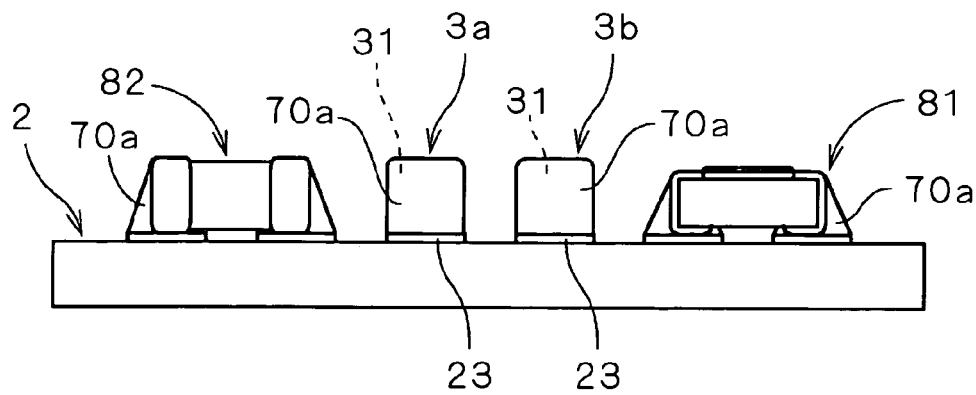
FIG. 4C is a view illustrating mounting of the first chip component.

FIG. 3 is a flow chart illustrating a method for mounting chip components during the fabrication of the circuit board 1, in focusing on the mounting of the first chip components 3a and 3b and the second chip component 4. Further, FIGS. 4A to 4C are views illustrating the state of mounting of the first chip components 3a and 3b, and FIG. 5A to FIG. 5D are views illustrating the state of mounting of the second chip component 4. Hereinafter, there will be described a method for mounting chip components during the fabrication of the circuit board 1.

At first, as illustrated in FIG. 4A, paste-type solder (hereinafter, referred to as "first solder") 71 is placed, through screen printing, onto the respective electrodes 23 on the substrate 2 including electrode patterns formed on the substrate main body 21 (step S11). The first solder 71 is so-called cream solder, which is paste-type solder formed by mixing powder-type solder with viscous flux.

Then, as illustrated in FIG. 4B, the first chip components 3a and 3b are mounted on the first solder 71 on the substrate 2 (step S12). At this time, as required, other chip components 81 and 82, packaged electronic components (not illustrated) and the like are also mounted on the first solder 71 similarly to the first chip components 3a and 3b.

Then, the substrate 2 is transferred into a reflowing apparatus, and the first solder 71 is heated to be molten in a hot bath, which vaporizes the flux constituent while leaving only the solder constituent. Then, the first solder 71 is cooled down to be solidified into solid solder 70a, which causes the electrodes 31 of the first chip components 3a and 3b to be electrically connected and mechanically secured to the electrodes 23 on the substrate 2 as illustrated in FIG. 4C, and thus, the mounting of the first chip components 3a and 3b onto the substrate 2 has been completed (step S13). The other chip components 81 and 82, the packaged electronic components (not illustrated) and the like are also secured on the substrate 2, similarly to the first chip components 3a and 3b.

Figure 5A:
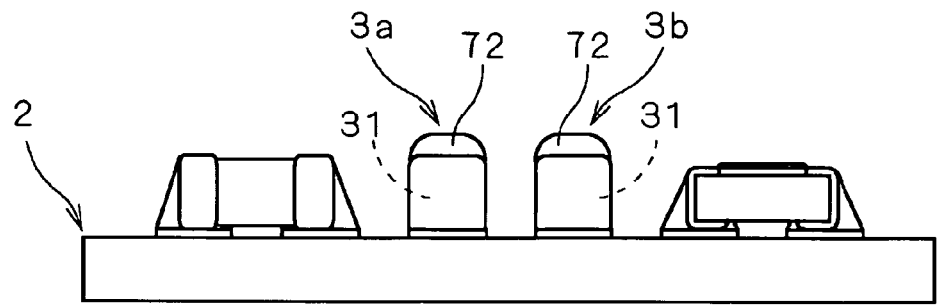
FIG. 5A is a view illustrating mounting of a second chip component.
Figure 5B:
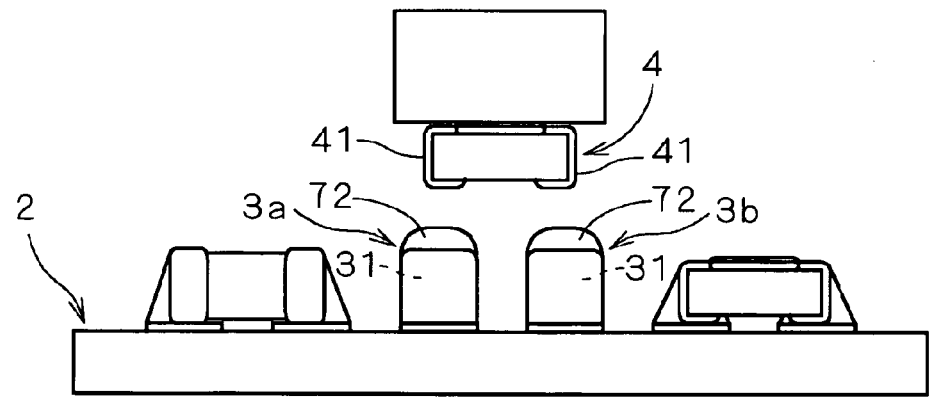
FIG. 5B is a view illustrating mounting of the second chip component.

Next, as illustrated in FIG. 5A, second solder 72 which is paste-type cream solder is placed on the electrodes 31 of the first chip components 3a and 3b through screen printing or using a fine nozzle (step S14). Then, as illustrated in FIG. 5B, the second chip component 4 is mounted on the second solder 72, such that one of the electrodes 41 of the second chip component 4 is positioned on an electrode 31 of the first chip component 3a while the other electrode 41 is positioned on an electrode 31 of the first chip component 3b. Namely, the second chip component 4 is mounted on the sides of the first chip components 3a and 3b which are opposite from the substrate 2 such that it straddles the first chip components 3a and 3b (step S15).

Figure 5C:
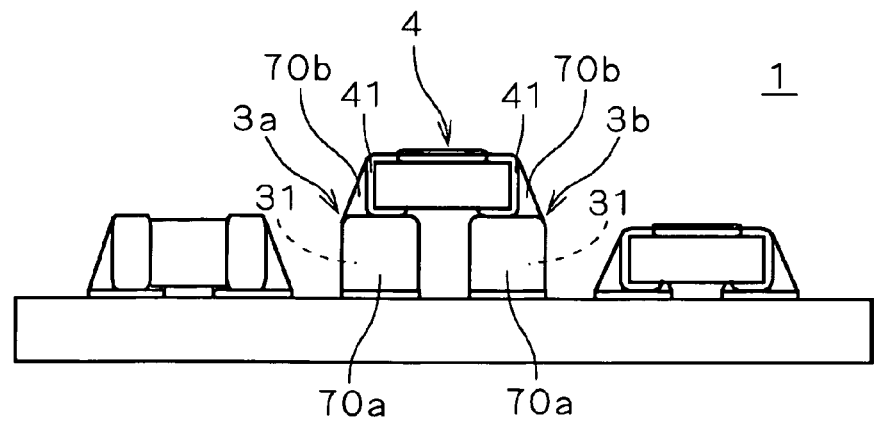
FIG. 5C is a view illustrating mounting of the second chip component.

Then, the substrate 2 is transferred into the reflowing apparatus, again, and the second solder 72 is molten in the hot bath and then is cooled down to be solidified into solid solder 70b, which causes the electrodes 31 of the first chip components 3a and 3b to be electrically connected and mechanically secured to the electrodes 41 of the second chip component 4, as illustrated in FIG. 5C. Thus, the mounting of the second chip component 4 onto the first chip components 3a and 3b has been completed (step S16).

Further, during melding the second solder 72, the solder 70a which has been solidified may be molten again. However, if such re-melting is not desirable, second solder 72 having a melting point lower than the re-melting temperature of the solder 70a, namely the first solder 71, is employed, and the temperature of the second reflowing is set to a temperature which can melt the second solder 72 while preventing the solder 70a from being re-molten.

Also, when the second solder 72 is melted, it is possible to locally heat only a portion of the substrate 2 which includes the second chip component 4, using hot air or light. This enables mounting the second chip component 4 onto the first chip components 3a and 3b while suppressing the influences on the other portion of the substrate 2.

Figure 5D:
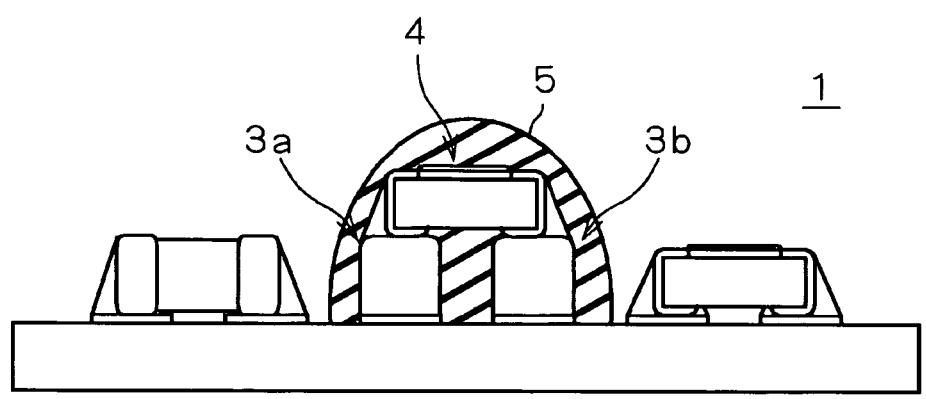
FIG. 5D is a view illustrating mounting of the second chip component.

Thereafter, as illustrated in FIG. 5D, a reinforcing resin 5 for reinforcing the junctions between electrodes is applied thereto using a nozzle, such that it covers the first chip components 3a and 3b and the second chip component 4 and covers either only the under fill or at least the junctions between electrodes (step S17). Thereafter, the reinforcing resin 5 is cured (step S18) Further, the reinforcing resin 5 may be a resin which can be cured by light or heat or a resin which is naturally cured. By providing the reinforcing resin 5, it is possible to reinforce the structure constituted by the first chip components 3a and 3b and the second chip component 4, thereby improving the reliability of the circuit board 1.

Through the aforementioned processes, the mounting of the first chip components 3a and 3b and the second component 4 has been completed, and thus, the circuit board 1 has been provided, wherein the circuit board 1 includes the first chip components 3a and 3b mounted on the substrate 2 through the solder 70a and the second chip component 4 mounted on the first chip components 3a and 3b through the solder 70b (see FIG. 1, FIG. 2 and FIG. 5C).

Figure 6:
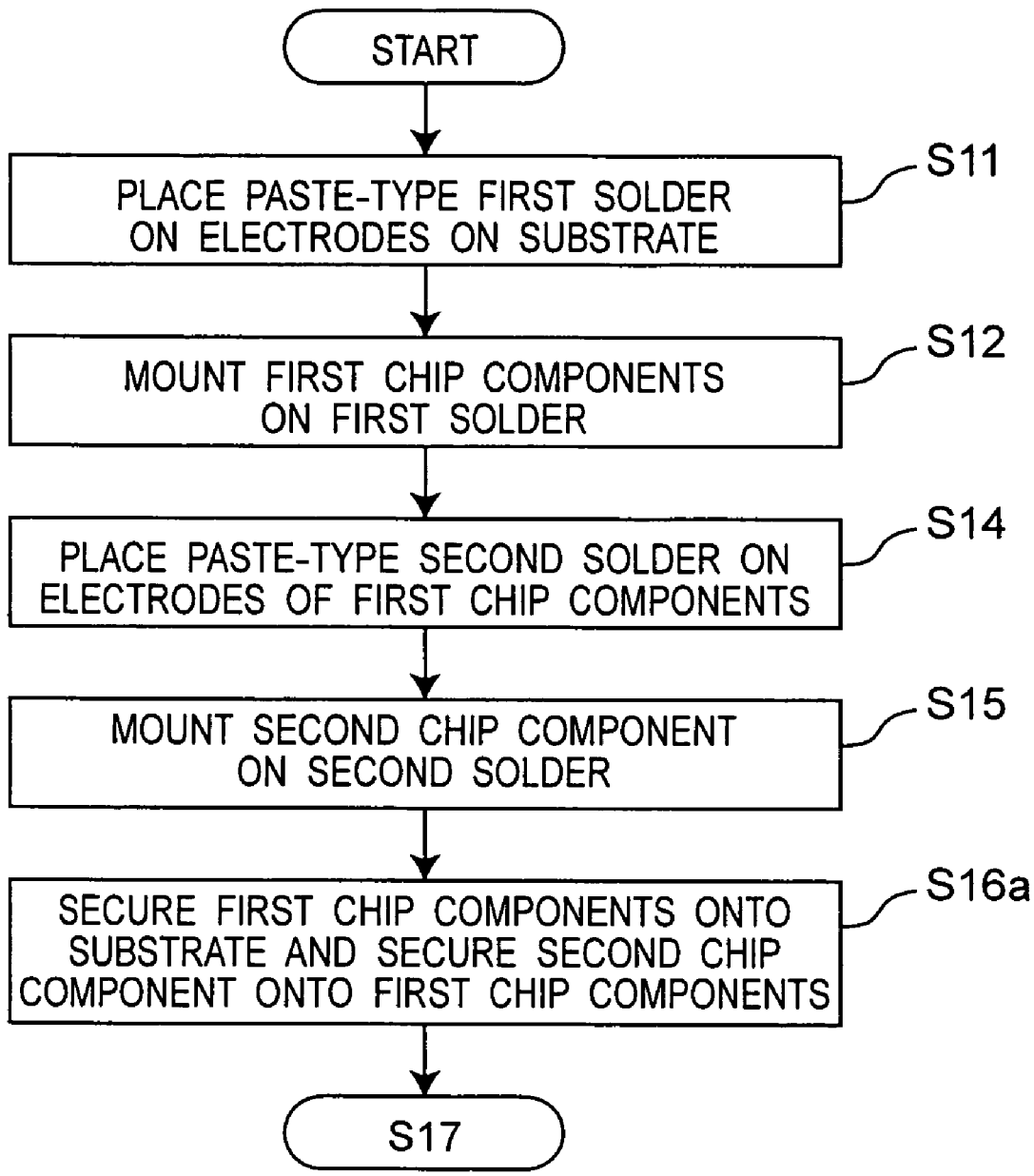
FIG. 6 is a flow chart illustrating another chip-component mounting method.
Figure 7A:
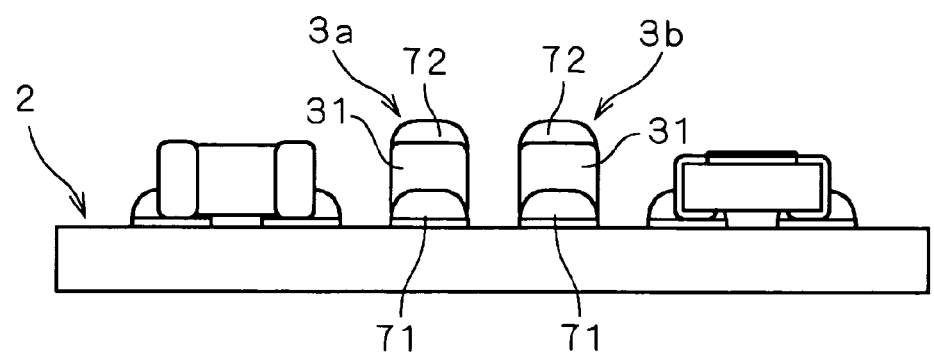
FIG. 7A is a view illustrating mounting of first and second chip components.
Figure 7B:
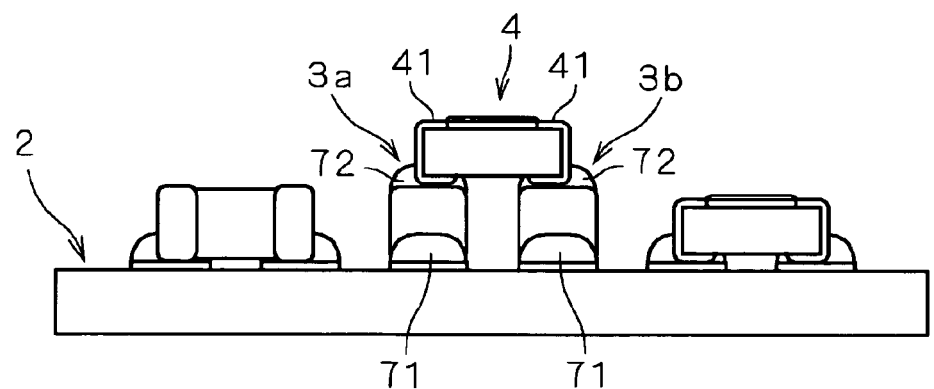
FIG. 7B is a view illustrating mounting of the first and second chip components.

FIG. 6 is a flow chart illustrating another method for mounting chip components during fabrication of a circuit board 1. In FIG. 6, the step S13 of FIG. 3 is omitted and a step S16a is performed instead of the step S16. Further, FIG. 7A and FIG. 7B are views illustrating the actual state of mounting according to the method illustrated in FIG. 6.

According to the method for mounting chip components illustrated in FIG. 6, first solder 71 is placed on the electrodes 23 on the substrate 2, and the first chip components 3a and 3b are mounted on the substrate 2 through the first solder 71, similarly to the case of FIG. 3 (steps S11 and S12). Then, second solder 72 is placed on the electrodes 31 of the first chip components 3a and 3b as illustrated in FIG. 7A. Then, the second chip component 4 is mounted on the sides of the first chip components 3a and 3b opposite from the substrate 2, such that the electrodes 41 of the second chip component 4 is positioned on the second solder 72, more specifically one of the electrodes 41 of the second chip component 4 is positioned on an electrode 31 of the first chip component 3a while the other electrode 41 is positioned on an electrode 31 of the first chip component 3b, as illustrated in FIG. 7B (steps S14 and S15).

Then, the substrate 2 is transferred into the reflowing apparatus, and the first solder 71 and the second solder 72 are molten, cooled and then solidified to electrically connect and secure the electrodes 31 of the first chip components 3a and 3b to the electrodes 23 on the substrate 2 through the solder 70a and also to electrically connect and secure the electrodes 41 of the second chip component 4 to the electrodes 31 of the first chip components 3a and 3b through the solder 70b, and thus, the circuit board 1 illustrated in FIG. 5C is provided (step S16a). Thereafter, a reinforcing resin 5 is applied and cured to complete the fabrication of the circuit board 1 (FIG. 3, steps S17 and S18).

As illustrated in FIG. 6, it is also possible to concurrently perform the securing of the first chip components 3a and 3b onto the substrate 2 and the securing of the second chip component 4 onto the first chip components 3a and 3b, namely the mounting of the first chip components 3a and 3b and the mounting of the second chip component 4. In this case, it is possible to perform the mounting operation with higher efficiency.

Figure 8:
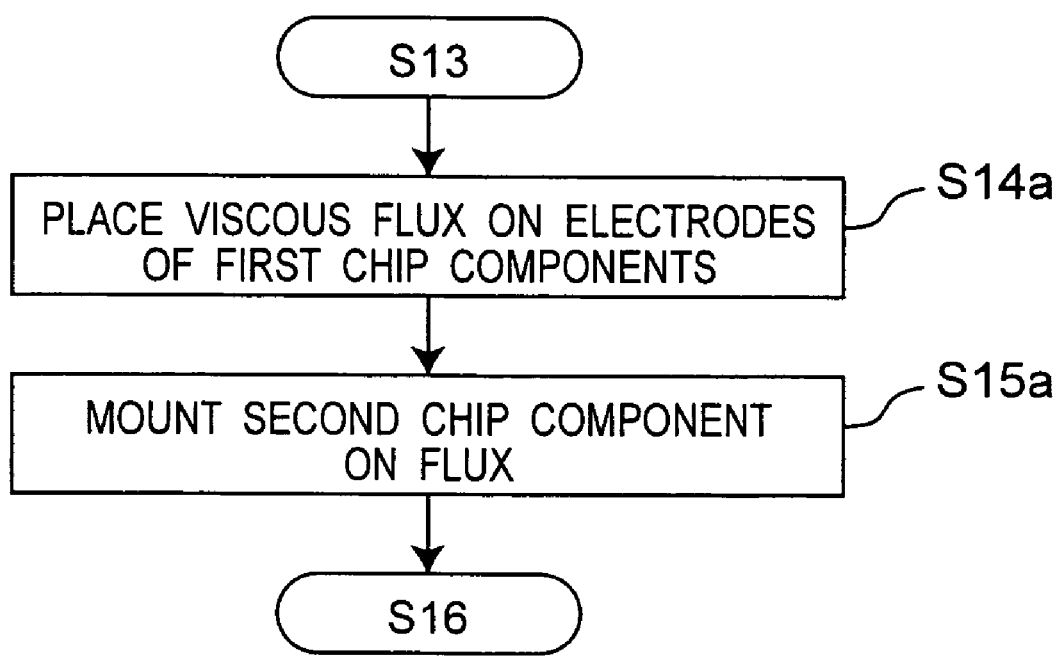
FIG. 8 is a flow chart illustrating further a different chip-component mounting method.

FIG. 8 is a flow chart illustrating further a different method for mounting chip components. There are illustrated processes which are performed instead of the steps S14 and S15 of FIG. 3. Further, FIG. 9A and FIG. 9B are views illustrating the actual state of mounting of the second chip component 4 according to the method illustrated in FIG. 8.

Figure 9A:
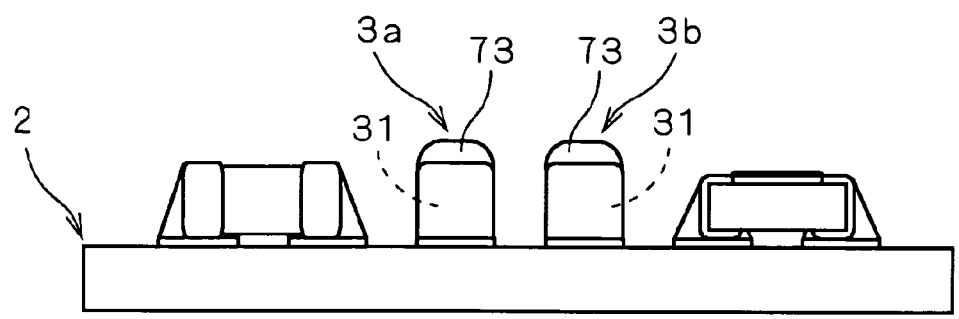
FIG. 9A is a view illustrating mounting of a second chip component.
Figure 9B:
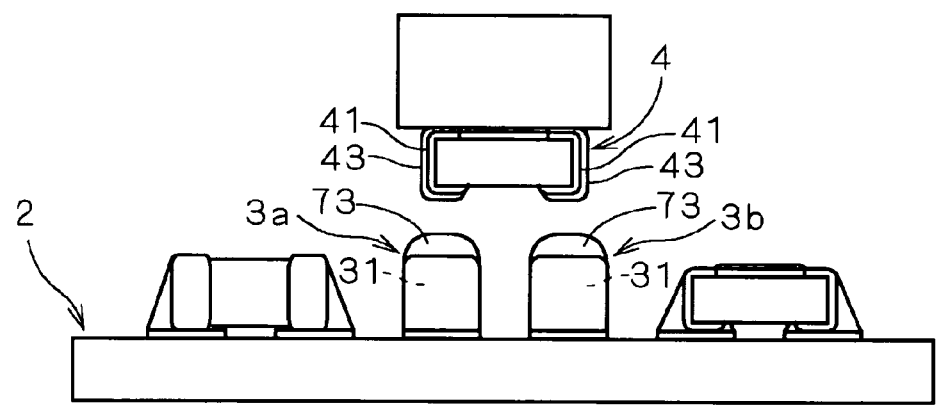
FIG. 9B is a view illustrating mounting of the second chip component.

According to the method for mounting chip components illustrated in FIG. 8, at first, the first chip components 3a and 3b are mounted on the substrate 2, similarly to the case of FIG. 3 (FIG. 3, steps S11 to S13), and thereafter, as illustrated in FIG. 9A, viscous flux 73 is placed on the electrodes 31 of the first chip components 3a and 3b using a fine nozzle or through screen printing (step S14a). Then, as illustrated in FIG. 9B, the second chip component 4 is mounted on the flux 73 such that one of the electrodes 41 of the second chip component 4 is positioned on an electrode 31 of the first chip component 3a while the other electrode 41 is positioned on an electrode 31 of the first chip component 3b, and then, they are provisionally secured (step S15a). In this case, as the second chip component 4, a chip component including a solder layer 43 which has been formed as precoat on the electrodes 41 through plating, dipping or the like is employed.

Then, the substrate 2 is transferred into the reflowing apparatus, and the solder layer 43 is molten in the hot bath and then is cooled down to be changed to solder 70b, which causes the electrodes 31 of the first chip components 3a and 3b to be electrically connected and mechanically secured to the electrodes 41 of the second chip component 4, as illustrated in FIG. 5C. Thus, the second chip component 4 has been mounted on the first chip components 3a and 3b (FIG. 3: step S16). Also, in order to suppress the influences on the portion of the substrate 2 other than the region of the second chip component 4, during the melting of the solder layer 43, it is possible to locally heat only a portion of the substrate 2 which includes the second chip component 4, using hot air or light. Thereafter, a reinforcing resin 5 is coated and cured to complete the fabrication of the circuit board 1 (steps S17 and S18).

In this case, the steps S14 and S15 according to the chip-component mounting method illustrated in FIG. 6 may be substituted for the steps S14a and S15a illustrated in FIG. 8. Namely, the first chip components 3a and 3b may be mounted on the substrate 2 through the first solder 71, then the second chip component 4 including the solder layer 43 may be mounted on the first chip components 3a and 3b through viscous flux, and thereafter, they are concurrently subjected to reflowing.

By using the second chip component 4 including the solder layer 43 as precoat, it is possible to simplify the mounting operation. Also, each of the first chip components 3a and 3b may include a solder layer as precoat, and the solder 70b between each of the first chip components 3a and 3b and the second chip component 4 may be, prior to bonding, either a solder layer which has been formed on the electrodes 31 of the first chip components 3a and 3b or a solder layer which has been formed on the electrodes 41 of the second chip component 4.

Figure 10:
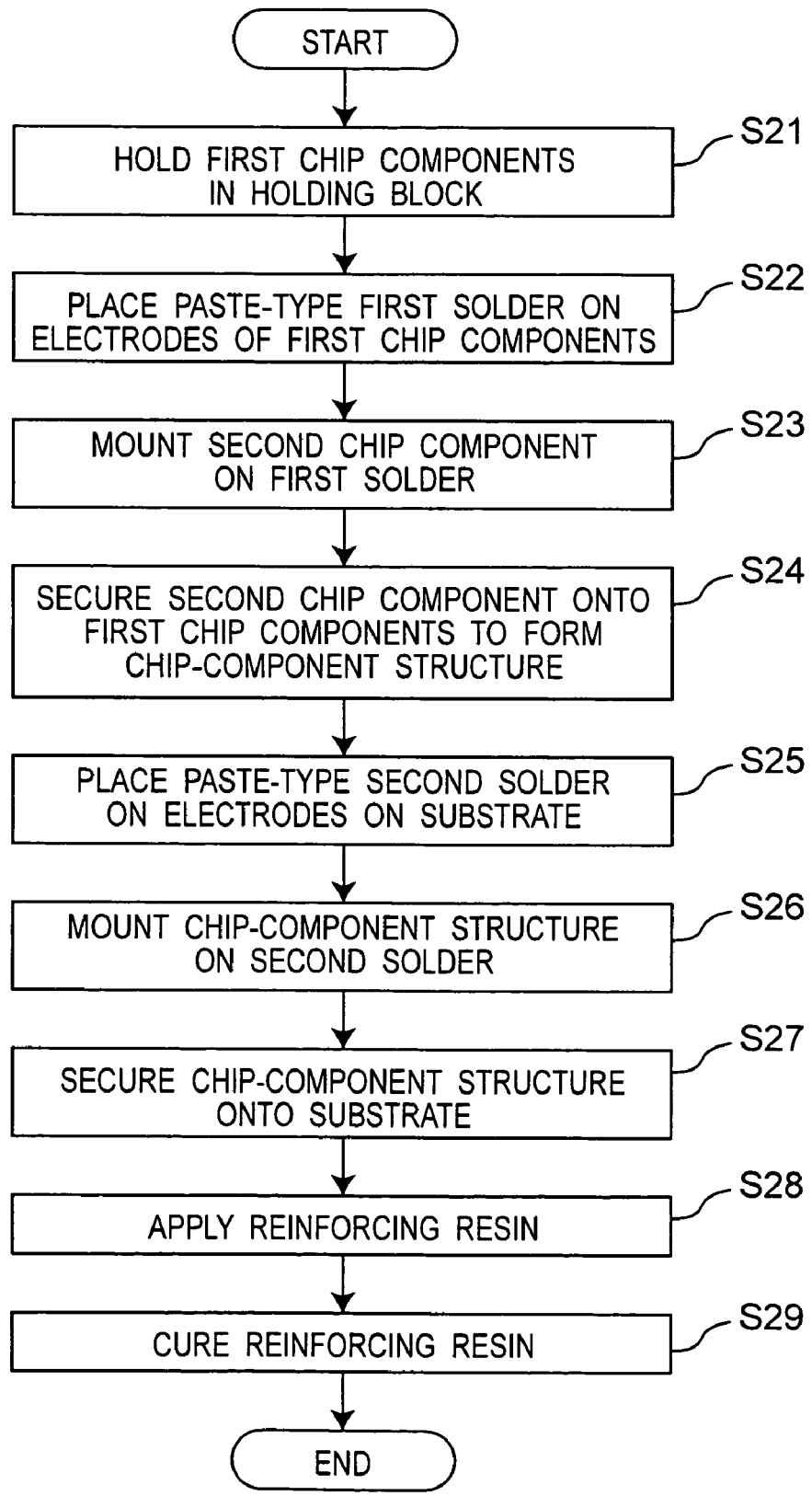
FIG. 10 is a flow chart illustrating further a different chip-component mounting method.

FIG. 10 is a flow chart illustrating further a different method for mounting chip components during fabrication of a printed circuit board 1, in focusing on the mounting of the first chip components 3a and 3b and the second chip component 4. FIGS. 11A to 11D and FIGS. 12A to 12C are views illustrating the state of mounting of the first chip components 3a and 3b and the second chip component 4.

Figure 11A:
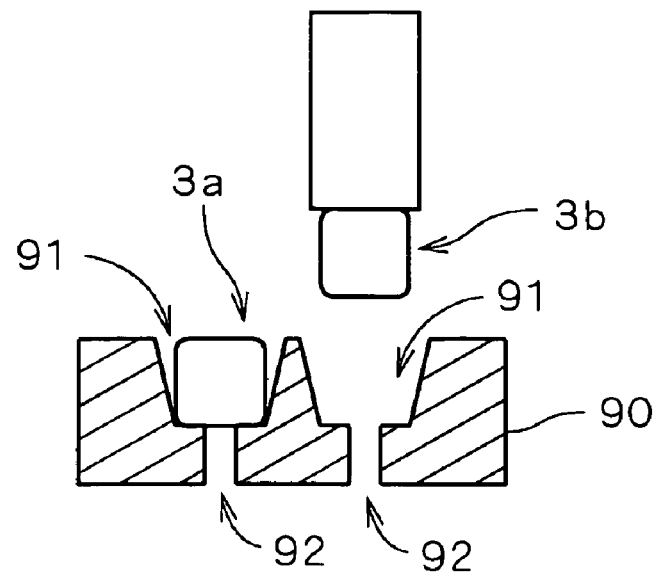
FIG. 11A is a view illustrating formation of a chip-component structure.
Figure 11B:
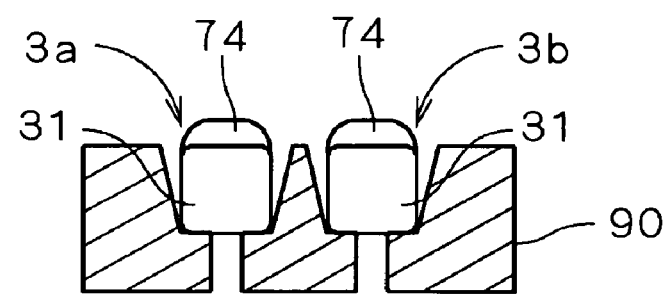
FIG. 11B is a view illustrating formation of the chip-component structure.

According to the method for mounting chip components illustrated in FIG. 10, at first, the first chip components 3a and 3b are inserted into concave portions 91 of a holding block 90, and then, suction is performed through suction ports 92 formed through the bottom surfaces of the concave portions 91 to hold these components, as illustrated in FIG. 11A (step S21). Each of the concave portions 91 have a tapered cross-sectional area having a width gradually reduced toward the bottom thereof, in order to facilitate the insertion of the first chip components 3a and 3b into the concave portions 91 and also accurately position them when inserting and holding them. When the first chip components 3a and 3b are held therein, the interval between both the chip components is equal to the interval in FIG. 1. As illustrated in FIG. 11B, paste-type solder (hereinafter, referred to as "first solder") 74 is placed on the electrodes 31 of the first chip components 3a and 3b through screen printing or using a nozzle (step S22) By using the holding block 90, it is possible to facilitate the attachment of the solder.

Figure 11C:
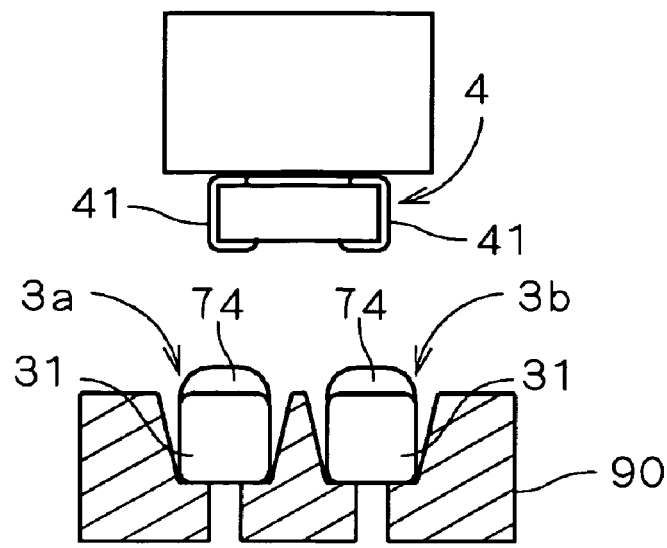
FIG. 11C is a view illustrating formation of the chip-component structure.

Then, as illustrated in FIG. 11C, the second chip component 4 is mounted on the first solder 74 on the first chip components 3a and 3b, such that one of the electrodes 41 of the second chip component 4 is positioned on an electrode 31 of the first chip component 3a while the other electrode 41 is positioned on an electrode 31 of the first chip component 31b (step S23).

Then, the holding block 90 is transferred into the reflowing apparatus, and the first solder 74 is heated to be molten and then is cooled down to change the first solder 74 to solid solder 70b, which causes the electrodes 41 of the second chip component 4 to be electrically connected and mechanically secured to the electrodes 31 of the first chip components 3a and 3b, as illustrated in FIG. 1D. Thus, the fabrication of a chip-component configuration 10 has been completed, wherein the chip-component configuration 10 includes the first chip components 3a and 3b and the second chip component 4 secured in a bridge shape (step S24).

Figure 12A:
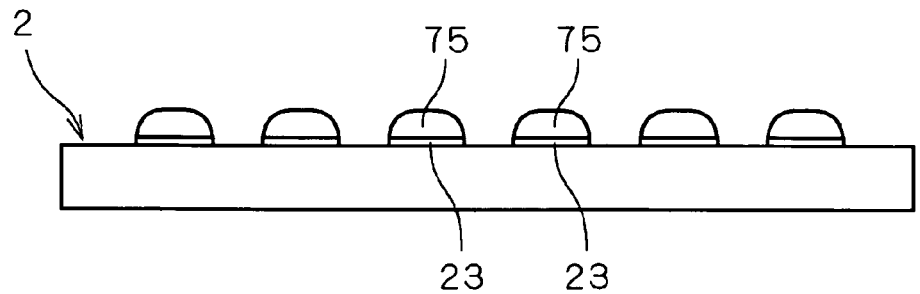
FIG. 12A is a view illustrating mounting of a chip-component structure.
Figure 12B:
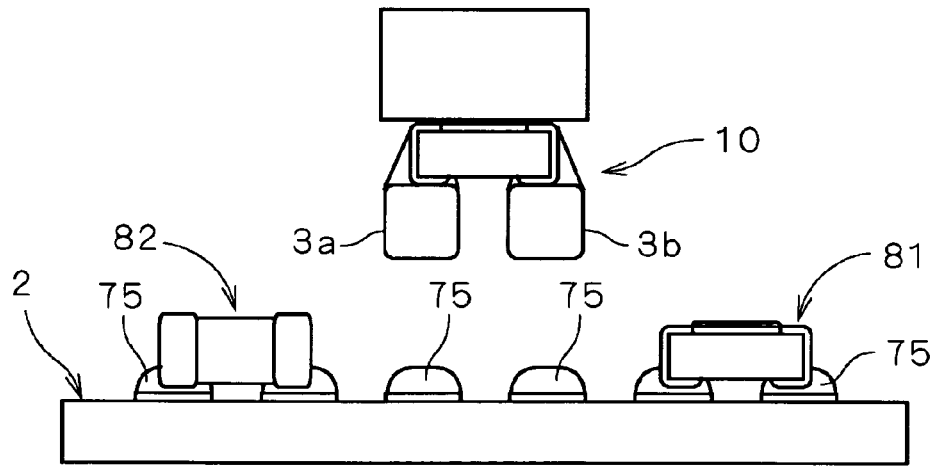
FIG. 12B is a view illustrating mounting of the chip-component structure.

Next, as illustrated in FIG. 12A, paste-type solder (hereinafter, referred to as "second solder") 75 is placed on the electrodes 23 on the substrate 2 (step S25), and, as illustrated in FIG. 12B, the chip-component structure 10 is mounted on the substrate 2 such that the first chip components 3a and 3b are faced to the substrate 2 (step S26). At this time, as required, other chip components 81 and 82, packaged electronic components (not illustrated) and the like are also mounted on the second solder 75, similarly to the chip-component structure 10.

Figure 12C:
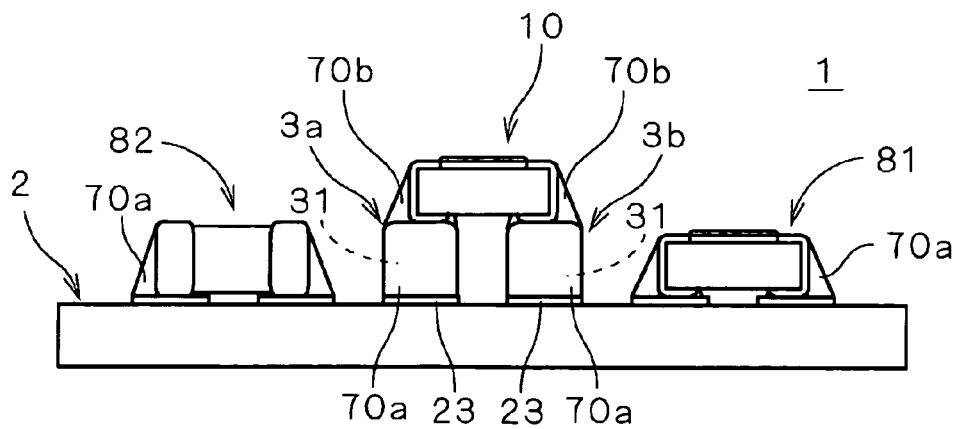
FIG. 12C is a view illustrating mounting of the chip-component structure.

Then, the substrate 2 is transferred into the reflowing apparatus, and the second solder 75 is heated to be molten and then is cooled down, which changes the second solder 75 to solid solder 70a, which causes the electrodes 31 of the first chip components 3a and 3b in the chip-component structure 10 to be electrically connected and mechanically secured to the electrodes 23 on the substrate 2, as illustrated in FIG. 12C. Thus, the chip-component structure 10 has been mounted on the substrate 2 (step S27) The other chip components 81 and 82, the packaged electronic components (not illustrated) and the like are also mounted on the substrate 2, similarly to the chip-component structure 10.

Further, when the second solder 75 is molten, the solder 70b which has been solidified may be molten again. However, if such re-melting is not desirable, second solder 75 having a melting point lower than the re-melting temperature of the solder 70b, namely the first solder 74, is employed, and the temperature of the second reflowing is set to a temperature which can melt the second solder 75 while preventing the solder 70b from being re-molten.

Then, a reinforcing resin 5 is coated and cured to complete the fabrication of the circuit board 1 (refer to steps S28, S29 and FIG. 5D).

Through the aforementioned processes, the mounting of the first chip components 3a and 3b and the second component 4 has been completed, and thus, the circuit board 1 has been provided, wherein the circuit board 1 includes the first chip components 3a and 3b mounted on the substrate 2 through the solder 70a and the second chip component 4 mounted on the first chip components 3a and 3b through the solder 70b (see FIG. 1, FIG. 2 and FIG. 12C).

Figure 13:
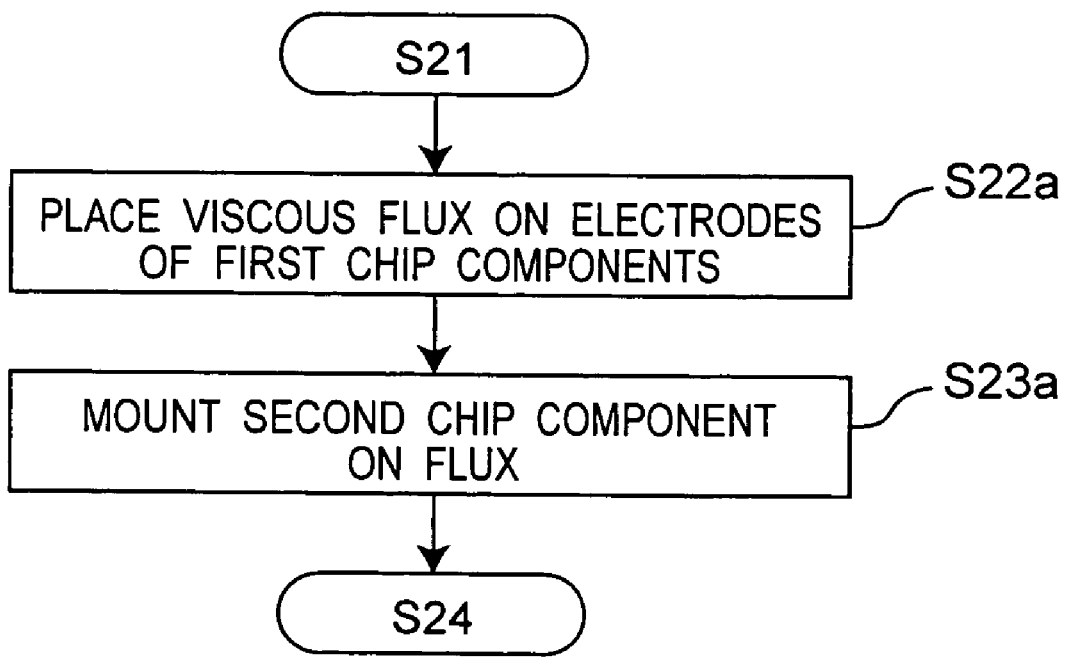
FIG. 13 is a flow chart illustrating further a different chip-component mounting method.

FIG. 13 is a flow chart illustrating another method for mounting chip components, wherein there are illustrated processes which are performed instead of the steps S22 and S23 of FIG. 10. Further, FIG. 14A and FIG. 14B are views illustrating the formation of a chip-component structure 10 according to the method illustrated in FIG. 13.

Figure 14A:
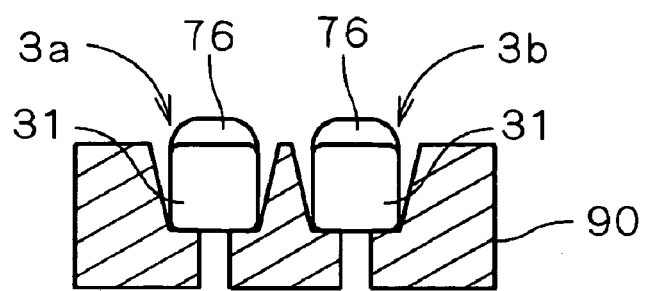
FIG. 14A is a view illustrating formation of a chip-component structure.
Figure 14B:
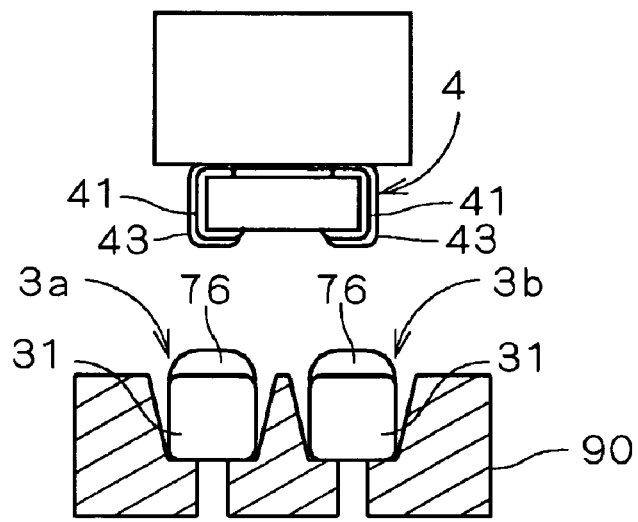
FIG. 14B is a view illustrating formation of the chip-component structure.

According to the method for mounting chip components illustrated in FIG. 13, at first, similarly to the case of FIG. 10, the first chip components 3a and 3b are held in a holding block 90 (FIG. 10: step S21), and then, viscous flux 76 is placed on the electrodes 31 of the first chip components 3a and 3b by using a fine nozzle or through screen printing (FIG. 13: step S22a), as illustrated in FIG. 14A. Subsequently, as illustrated in FIG. 14B, the second chip component 4 is mounted on the flux 76 such that one of the electrodes 41 of the second chip component 4 is positioned on the electrode 31 of the first chip component 3a while the other electrode 41 is positioned on the electrode 31 of the first chip component 3b, and they are provisionally secured (step S23a). In this case, as the second chip component 4, a chip component including a solder layer 43 formed on the electrodes 41 is employed.

Figure 11D:
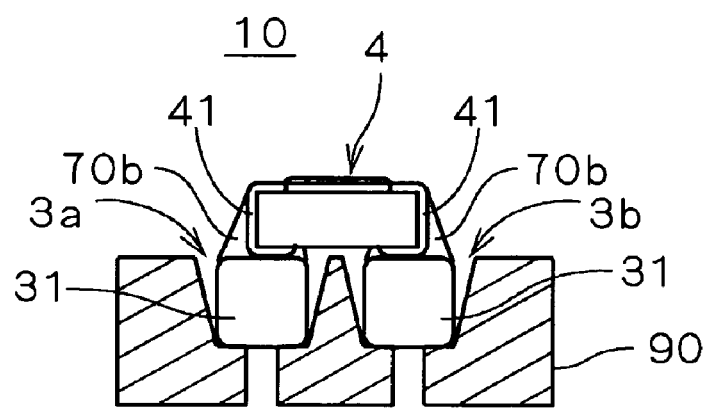
FIG. 11D is a view illustrating formation of the chip-component structure.

Then, the holding block 90 is transferred into the reflowing apparatus, and the solder layer 43 is molten in the hot bath and then is cooled down to changes the solder layer 43 to solder 70b, which causes the electrodes 31 of the first chip components 3a and 3b to be electrically connected and mechanically secured to the electrodes 41 of the second chip component 4, as illustrated in FIG. 11D. Thus, the second chip component 4 has been mounted on the first chip components 3a and 3b, and the fabrication of the chip-component structure 10 has been completed (FIG. 11: step S24). By using the second chip component 4 including the solder layer as precoat, it is possible to simplify the mounting operation. Hereinafter, similarly to the case of FIG. 10, the chip-component structure 10 is mounted on the substrate 2 to complete the fabrication of the circuit board 1 (steps S25 to S29).

There have been described the structures of circuit boards 1 and methods for mounting chip components, and the first chip components 3a and 3b and the second chip component 4 are tri-dimensionally mounted on the circuit board 1 such that the second chip component 4 is stacked on the first chip components 3a and 3b. This enables effectively utilizing the space usable for mounting to mount chip components on the substrate 2 with a higher density, thereby enabling reduction of the size of the circuit board 1.

Figure 15A:
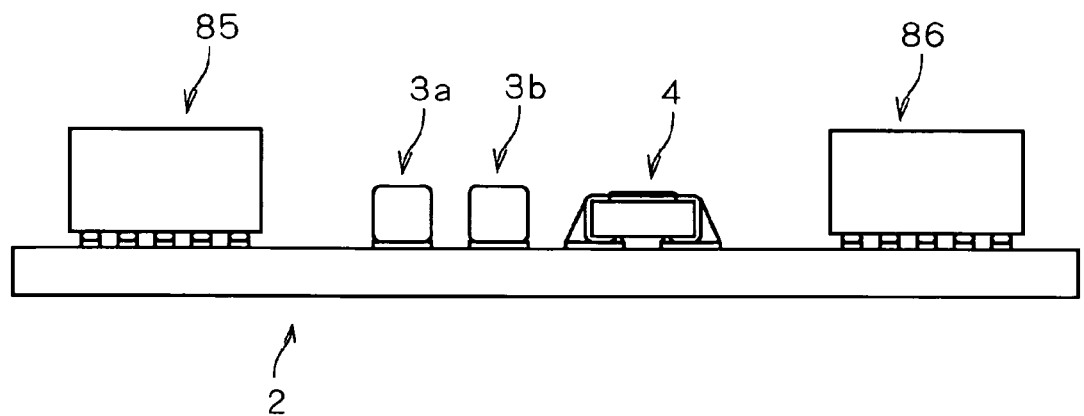
FIG. 15A is a view illustrating chip components which are not stacked.
Figure 15B:
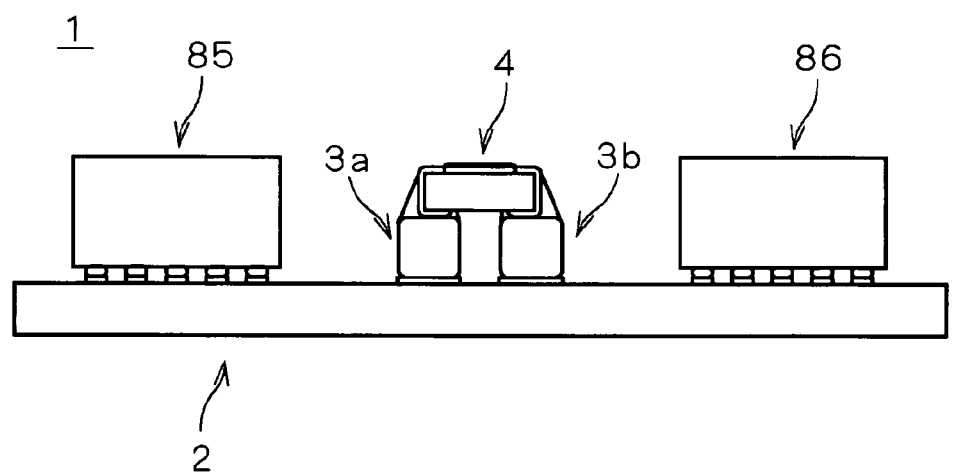
FIG. 15B is a view illustrating chip components which are stacked.

For example, when the first chip components 3a and 3b, the second chip component 4 and other packaged electronic components 85 and 86 are mounted on the substrate 2 as illustrated in FIG. 15A, there is left a space above the first chip components 3a and 3b and the second chip component 4, which increases a region required for mounting them. On the other hand, when the second chip component 4 is mounted on the first chip components 3a and 3b as in a circuit board 1 illustrated in FIG. 15B, the height of the upper surface of the second chip component 4 falls substantially equal to the heights of the packaged electronic components 85 and 86, which enables effectively utilizing the space above the substrate 2 to mount chip components with a higher density, thereby enabling reduction of the area of the circuit board 1 without largely increasing the thickness of the circuit board 1.

Further, in the circuit board 1, the first chip component 3a and the first chip component 3b have substantially the same height on the substrate 2, which enables stably stacking the second chip component 4 on the first chip components 3a and 3b. This can prevent mounting malfunctions, thereby improving the reliability of the circuit board 1.

FIGS. 16 to 22 are views illustrating another exemplary circuit board 1 including chip components stacked on a substrate 2, wherein the circuit board 1 is illustrated in three directions, similarly to in FIG. 2, and a front view, a plan view and a side view are illustrated in the lower-left portion, the upper-left portion and the lower-right portion, respectively. In these figures, the contours of solders 70a and 70b are illustrated by broken lines. In FIGS. 16 to 19, the solder 70b is not illustrated in the lower-right view, the solder 70a is not illustrated in the lower-left view, and the solders 70a and 70b and the electrodes on the substrate 2 are not illustrated in the upper-left view. Further, in actual, the stacked chip components are covered with a reinforcing resin.

Figure 16:
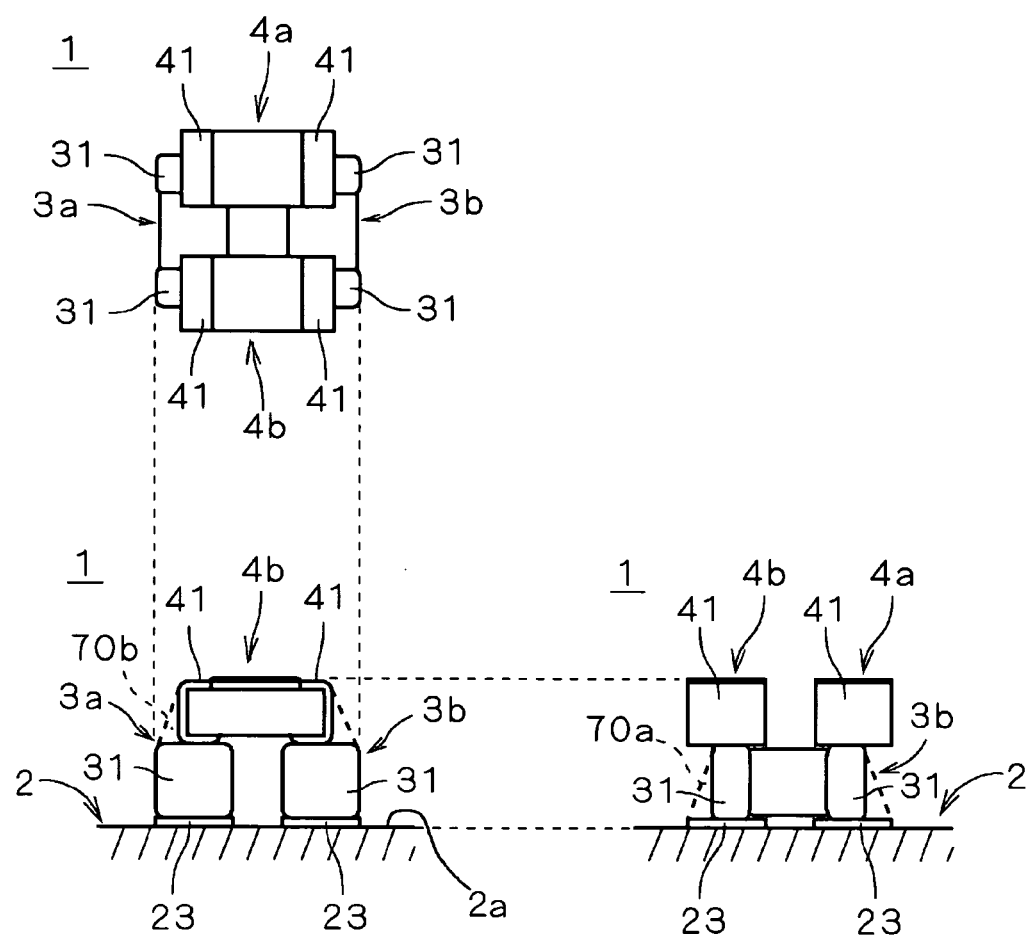
FIG. 16 is a view illustrating another exemplary structure on a circuit board.

In the circuit board 1 illustrated in FIG. 16, two first chip components 3a and 3b and two second chip components 4a and 4b are stacked in two stages perpendicularly to the surface of the substrate 2 so that they are tri-dimensionally mounted thereon in a bridge shape. In the example illustrated in FIG. 16, the first chip components 3a and 3b are chip condensers and the second chip components 4a and 4b are chip resistors. Similarly to in FIG. 2, the first chip components 3a and 3b are arranged on the substrate 2 such that their longitudinal directions are parallel to each other, and are mounted thereon by bonding their electrodes 31 to the electrodes 23 on the substrate 2 through solder 70a. Further, the first chip components 3a and 3b have substantially the same height on the substrate 2.

The second chip components 4a and 4b are mounted on the first chip components 3a and 3b through solder 70b. The second chip component 4a is bonded at one electrode 41 to one of the electrodes 31 of the first chip component 3a and also is bonded at the other electrode 41 to one of the electrodes 31 of the first chip component 3b. The second chip component 4b is bonded at one electrode 41 to the other electrode 31 of the first chip component 3a and also is bonded at the other electrode 41 to the other electrode 31 of the first chip component 3b. As illustrated in FIG. 16, two second chip components may be mounted on the two first chip components 3a and 3b, which can realize mounting with a higher density. Further, by changing the number and the placement of second chip components, it is possible to easily change the connection between the first chip components and the second chip components, which enables flexibly addressing the change in the circuit design.

Figure 17:
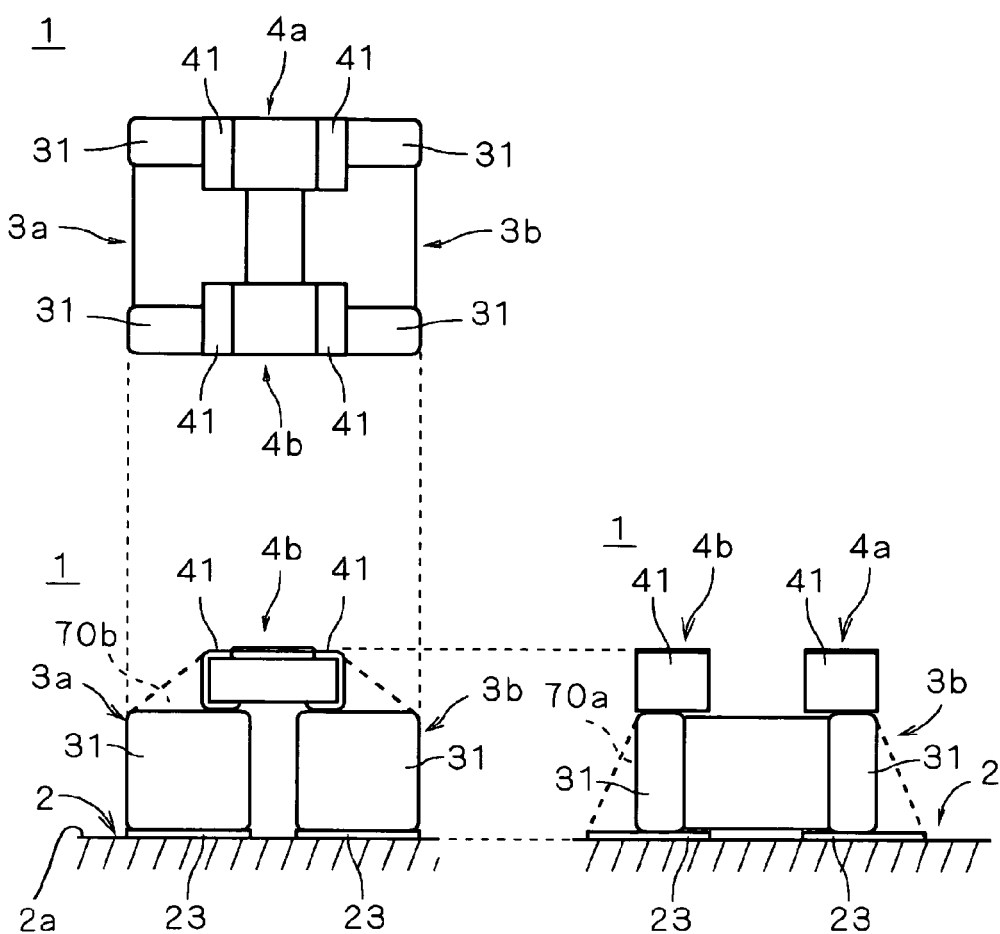
FIG. 17 is a view illustrating further a different exemplary structure on a circuit board.

The circuit board 1 illustrated in FIG. 17 is the same as that of FIG. 16 except that the two first chip components 3a and 3b are greater than the second chip components 4a and 4b relatively. Namely, the electrodes 31 of the first chip components 3a and 3b are bonded and secured on the electrodes 23 on the substrate 2 so that the first chip components 3a and 3b are mounted on the substrate 2 through solder 70a such that their longitudinal directions are parallel to each other and they are arranged in the direction perpendicular to their longitudinal directions. Further, the electrodes 41 of the second chip components 4a and 4b are bonded and secured on the electrodes 31 of the first chip components 3a and 3b so that the second chip components 4a and 4b are mounted on the first chip components 3a and 3b, respectively, through solder 70b, such that their longitudinal directions are perpendicular to the longitudinal directions of the first chip components 3a and 3b and they are arranged in parallel to each other. Provided that the first chip components have substantially the same height as described above, the first chip components and the second chip components may have various sizes.

Figure 18:
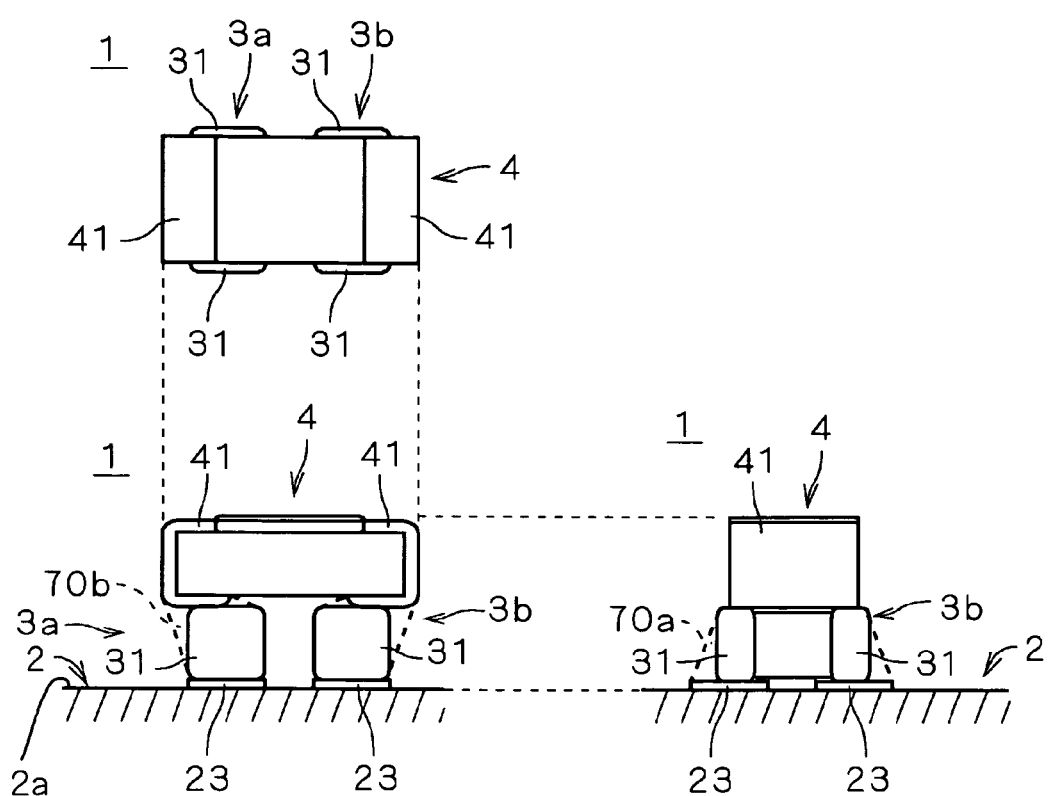
FIG. 18 is a view illustrating further a different exemplary structure on a circuit board.

In the circuit board 1 illustrated in FIG. 18, similarly to in FIG. 2, two first chip components 3a and 3b are placed on a substrate 2 such that their longitudinal directions are parallel to each other and are mounted thereon by bonding their electrodes 31 to electrodes 23 on the substrate 2 with solder 70a. Further, the second chip component 4 is tri-dimensionally mounted through solder 70b on the two first chip components 3a and 3b, namely such that they are stacked in two stages perpendicularly to the surface of the substrate 2. In this case, the second chip component 4 is greater than that illustrated in FIG. 2 and is connected at one electrode 41 to both the two electrodes 31 of the first chip component 3a while being connected at the other electrode 41 to both the two electrodes 31 of the first chip component 3b. As described above, a single electrode may be connected to two electrodes between stacked chip components.

Figure 19:
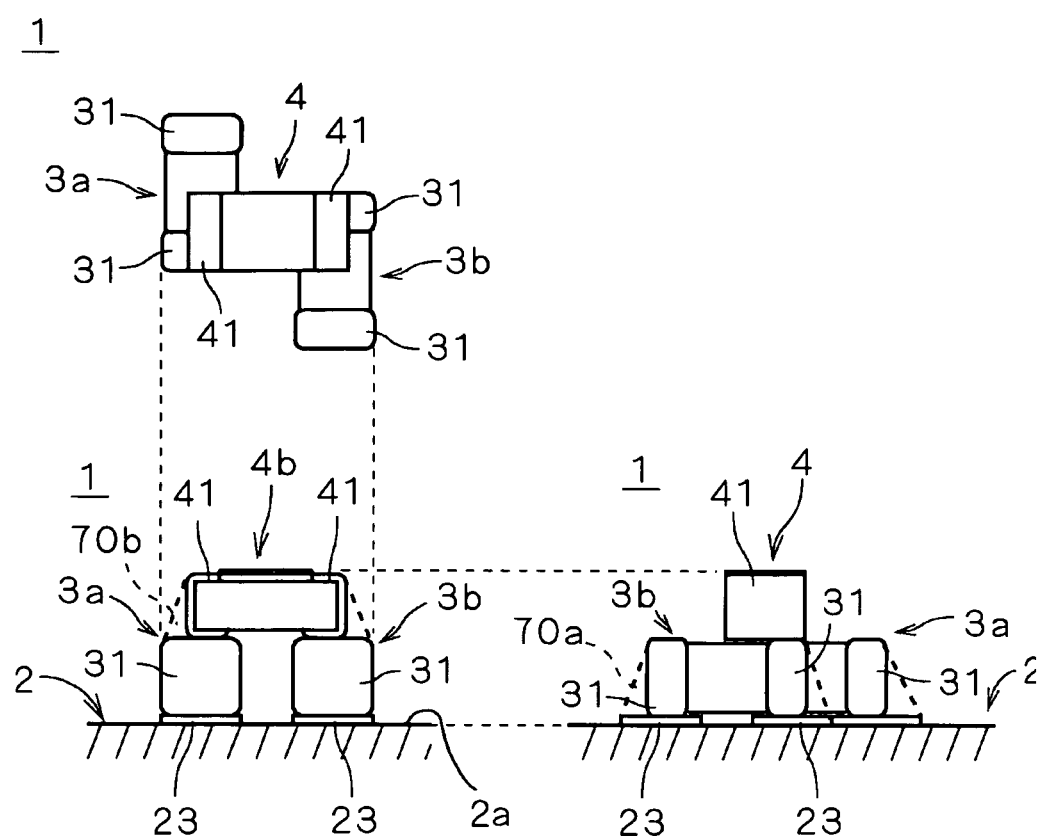
FIG. 19 is a view illustrating further a different exemplary structure on a circuit board.
Figure 20:
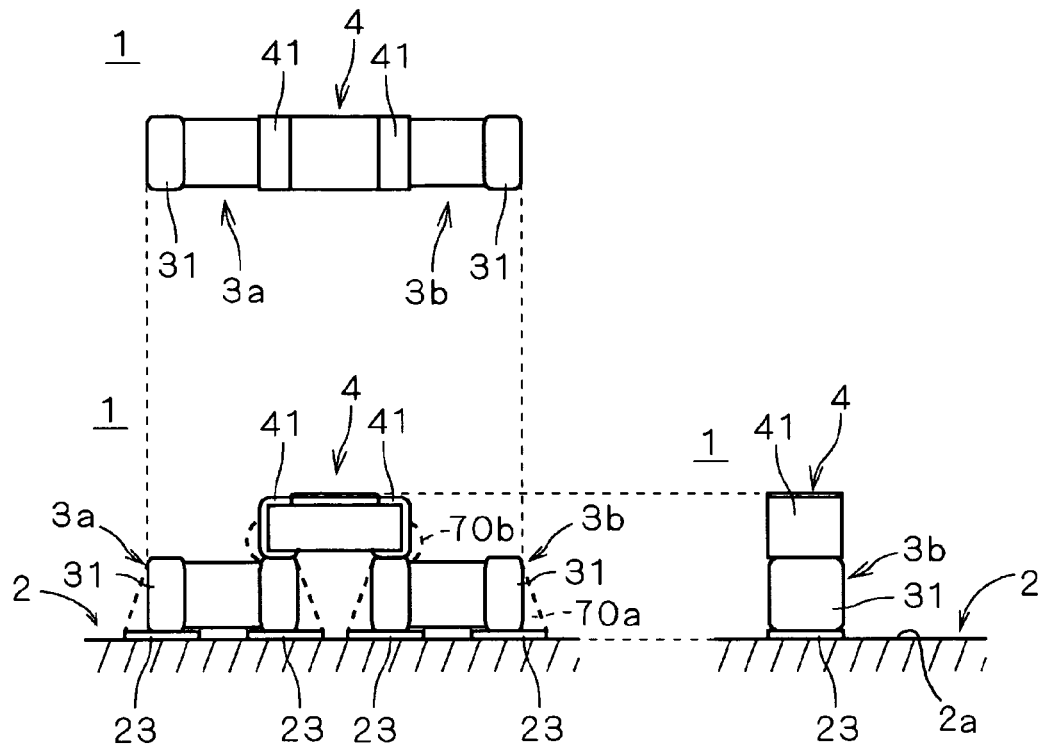
FIG. 20 is a view illustrating further a different exemplary structure on a circuit board.

FIG. 19 and FIG. 20 are views illustrating exemplary circuit boards which are different from the circuit board 1 illustrated in FIG. 2 in placement of first chip components 3a and 3b. In FIG. 20, solders 70a and 70b are illustrated in the lower-left portion. FIG. 19 illustrates a case where one of the first chip components 3a and 3b as illustrated in FIG. 2 is moved along its longitudinal direction to displace the first chip components 3a and 3b from each other. FIG. 20 illustrates a case where the two first chip components 3a and 3b are arranged along a straight line. The circuit boards 1 illustrated in FIGS. 19 and 20 are the same as that illustrated in FIG. 2 except the placement of the first chip components 3a and 3b, and the same reference characters are employed therefor.

Namely, the electrodes 31 of the first chip components 3a and 3b are secured on the electrodes 23 on the substrate 2 through solder 70a so that the first chip components 3a and 3b are mounted thereon, while the electrodes 41 of the second chip component 4 are secured on the electrodes 31 of the first chip components 3a and 3b through solder 70b so that the second chip component 4 is mounted thereon. Further, one of the electrodes 41 of the second chip component 4 is bonded to an electrode 31 of the first chip component 3a while the other electrode 41 is bonded to an electrode 31 of the first chip component 3b. As described above, with the bridge structure in which the respective electrodes of the second chip component 4 are bonded to the different first chip components 3a and 3b, it is possible to easily change the orientations of chip components and relative positional relationship thereamong.

Figure 21:
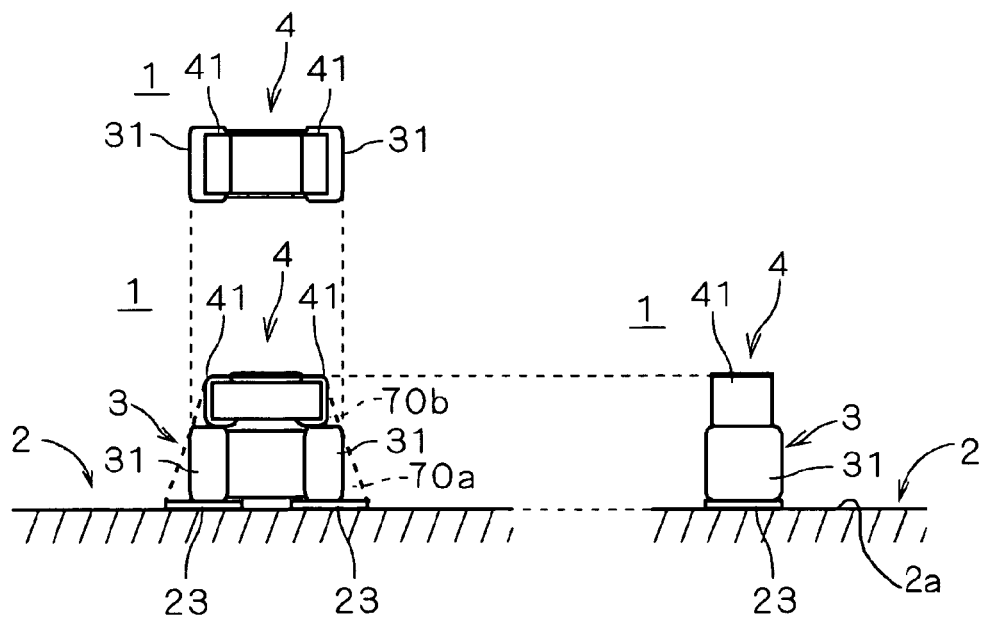
FIG. 21 is a view illustrating further a different exemplary structure on a circuit board.

In the circuit board 1 of FIG. 21, a single first chip component 3 and a single second chip component 4 are stacked in two stages perpendicularly to the surface of the substrate 2 so that they are tri-dimensionally mounted thereon, such that their longitudinal directions are coincident with each other. In the example illustrated in FIG. 21, the first chip component 3 is a chip condenser and the second chip component 4 is a chip resistor, wherein the first chip component 3 and the second chip component 4 have different sizes.

In the circuit board 1 illustrated in FIG. 21, similarly, the first chip component 3 is mounted on the electrodes 23 on the substrate 2 through solder 70a and the second chip component 4 is mounted on the electrodes 31 of the first chip component 3 through solder 70b. Namely, the second chip component 4 is connected at one electrode 41 to one of the electrodes 31 of the first chip component 3 and also is connected at the other electrode 41 to the other electrode 31 of the first chip component 3. As described above, there may be provided only a single first chip component 3 and only a single second chip component 4. Even in this case, by stacking different types of components with different sizes or functions, it is possible to enhance the tri-dimensionality of the circuit structure at various positions on the circuit board, thereby realizing reduction of the size of the circuit board.

Figure 22:
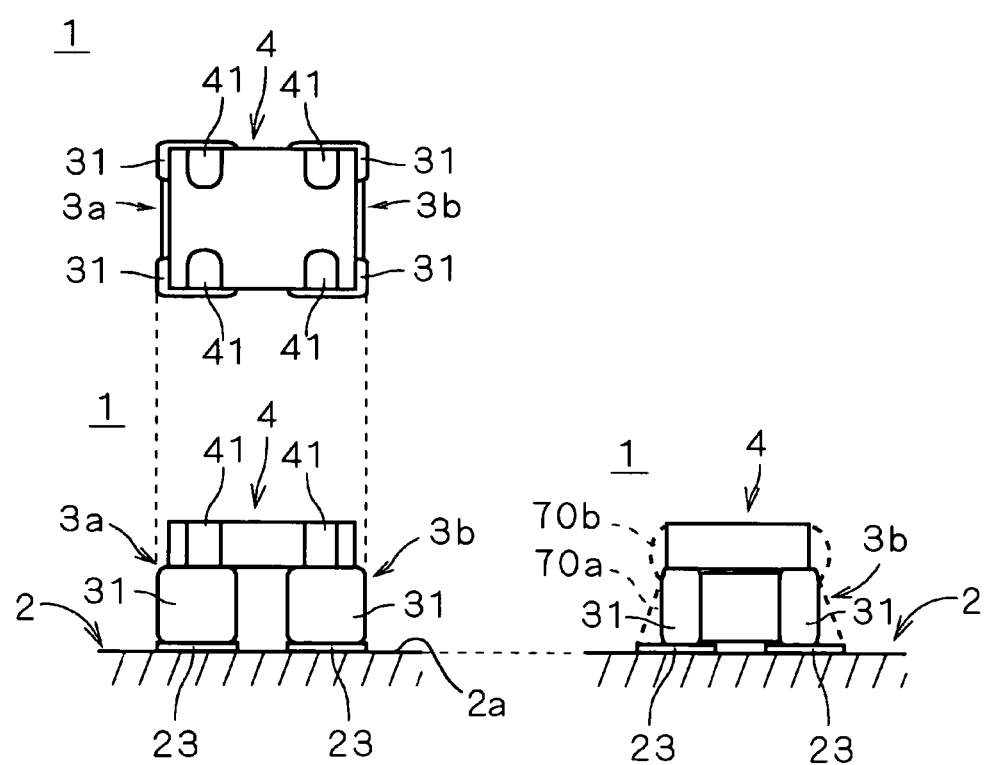
FIG. 22 is a view illustrating further a different exemplary structure on a circuit board.

In the circuit board 1 illustrated in FIG. 22, a multiple-component type chip component is employed as a second chip component 4. In FIG. 22, there is exemplified a second chip component 4 having four electrodes 41. The placement of the first chip components 3a and 3b is the same as that in FIG. 2. The first chip components 3a and 3b are mounted by bonding their electrodes 31 to the electrodes 23 on the substrate 2 through solder 70a, while the second chip component 4 is mounted on the first chip components 3a and 3b by bonding their respective electrodes 41 to the electrodes 31 of the two first chip components 3a and 3b through solder 70b. As described above, multiple-component type chip components may be employed, and the number of electrodes is not limited to two. Further, the first chip component may be a multiple-component type chip component.

Any of the circuit boards 1 illustrated in FIGS. 16 to 22 can be fabricated according to the method illustrated in FIG. 3, 6, 8 10 or 13. Further, by mounting the first and second chip components such that the second chip component is stacked on the first chip components perpendicularly to the substrate 2, it is possible to effectively utilize the space usable of mounting, thereby enabling reduction of the size of the circuit board 1, similarly to the circuit board 1 illustrated in FIG. 1 and FIG. 2. Further, by stacking different types of components, namely by forming, from different types of components, a single first chip component included in at least one first chip component mounted on the substrate 2 and a second chip component connected to an electrode of this first chip component, it is possible to realize flexible tri-dimensional circuit structure, thereby realizing significant reduction of the size of the circuit board 1.

Although there has been described the embodiment of the present invention, the present invention is not limited to the aforementioned embodiment and various changes can be made thereto.

While the first chip components mounted on the substrate 2 and the second chip component mounted on the first chip components are generally chip resistors, chip condensers or chip inductors, they may be either chip components having other functions or multiple-component type chip components such as multiple-component type chip resistors and chip-type networks. Such multiple-component type chip components may be components constituted by the same type of chip components connected to one another or different types of chip components connected to one another. Further, such multiple-component type chip components do not always have electrodes at their longitudinal end portions. Also, it is possible to employ chip components having shapes different from substantially rectangular-parallelepiped shapes, such as MELF resistors and cylindrical chip resistors.

The first chip components and the second chip component may have various sizes. In general, a plurality of fine chip components having lengths of 2 mm or less are mounted on a single substrate, and such chip components generally have heights of 1 mm or less and have no influences on the height of the circuit board when they are stacked in only two stages. Therefore, it is desirable to stack fine chip components having lengths of 2 mm or less.

While the first chip components are mounted on the substrate 2 through paste-type solder in the aforementioned embodiment, it is possible to form solder layers on the first chip components by pre-coating and mount the first chip components using the solder layers. Also, it is possible to mount the first chip components and the second chip component through other conductive bonding materials, such as silver paste and conductive resins. Also, it is possible to concurrently perform the mounting and the securing of chip components, such as the case of using a thermosetting adhesive resin. In this case, the mounting of the chip components is completed at the time when they have been mounted.

Three or more first chip components and second chip components may be provided, and these chip components may be placed in various manners. Namely, plural first chip components are mounted on a substrate 2 and at least a single second chip component is mounted on the first chip components, wherein a chip component included in the at least a single second component is bonded at one electrode to an electrode of a single first chip component and also is bonded at the other electrode to an electrode of another first chip component, which realizes highly tri-dimensional circuit structure, thereby realizing high-density mounting of the chip components. Further, the two first chip components which support the second chip component are formed to have substantially the same height on the substrate, which forms stable structure. It is also possible to provide, on the circuit board 1, structure of chip components mounted and stacked in three or more stages, as well as the structure of first chip components and second chip component which are stacked in two stages.

Second Embodiment

Figure 23:
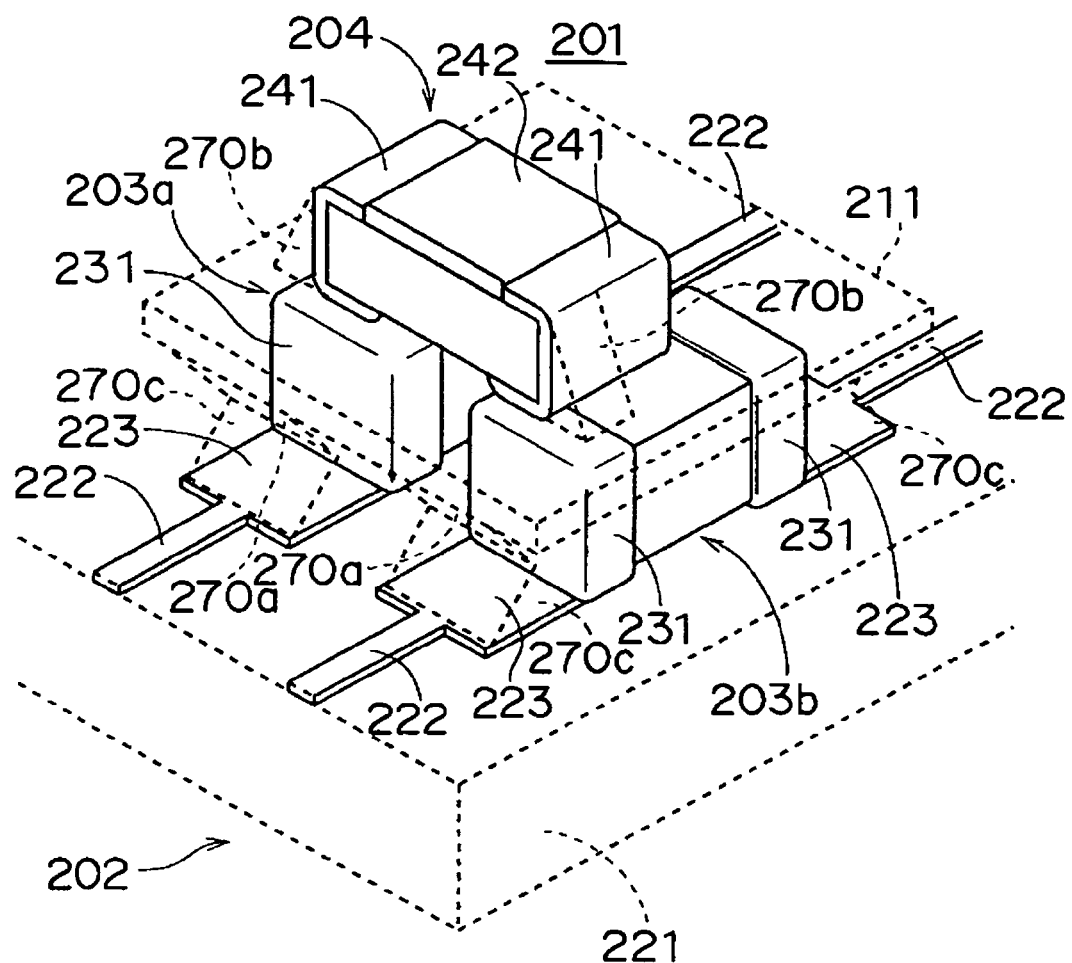
FIG. 23 is a perspective view illustrating a portion of a circuit board.
Figure 24:
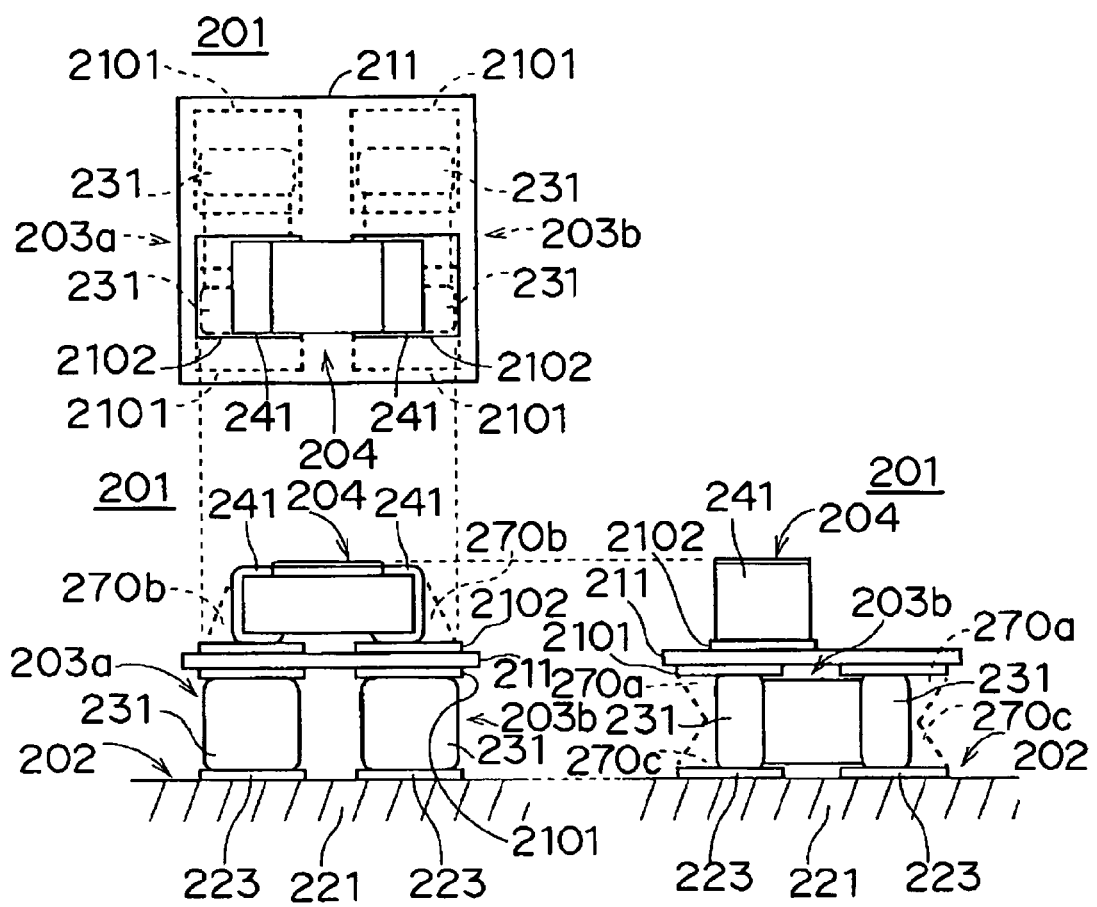
FIG. 24 is a view illustrating a structure on the circuit board.

FIG. 23 is a perspective view illustrating a portion of a circuit board 201 according to a second embodiment of the present invention. FIG. 24 is a view illustrating the structure illustrated in FIG. 23 in three directions, wherein a front view, a plan view and a side view are illustrated in the lower-left portion, the upper-left portion and the lower-right portion, respectively.

In FIGS. 23 and 24, the circuit board 201 which corresponds to a chip component assembly is illustrated as including a substrate 202, two chip components (hereinafter, referred to as "first chip components") 203a and 203b on the substrate 202, a secondary substrate 211 on the first chip components 203a and 203b, and a single chip component (hereinafter, referred to as "a second chip component") 204 on the secondary substrate 211, wherein the first chip components 203a and 203b, the secondary substrate 211 and the second chip component 204 are stacked in two stages perpendicularly to the surface of the substrate 202 through solder 270c, 270a and 270b, which is an exemplary bonding material, in the mentioned order, so that they are tri-dimensionally mounted. Further, the solder is continuously extended vertically along the side surfaces of the first chip components, wherein a lower portion of the solder is referred to as solder 270c and an upper portion thereof is referred to as solder 270a.

In FIG. 23, the contours of the secondary substrate 211 and the solder 270a, 270b and 270c are illustrated by broken lines for clearly illustrating the structure of the circuit board 201. In FIG. 24, the contours of the solder 270a, 270b and 270c are illustrated by broken lines, and the solder 270b is not illustrated in the lower-right view in FIG. 24, the solder 270a and 270c is not illustrated in the lower-left view, and the solder 270a, 270b and 270c and the electrodes on the substrate 202 are not illustrated in the upper-left view. As will be described later, in actual, the first chip components 203a and 203b, the secondary substrate 211 and the second chip component 204 are covered with a reinforcing resin for reinforcing the junctions of them.

The substrate 202 is a so-called wiring board including electrode patterns 222 formed on the surface of a substrate main body 221 as illustrated in FIG. 23, wherein portions of the electrode patterns 222 form electrodes 223 to be bonded to electrodes of electronic components. The substrate main body 221 is formed in a plate shape or a film shape from a resin or a ceramic such as a glass epoxy resin or polyimide resin, and the electrode patterns 222 and the electrodes 223 are made of cupper.

The first chip components 203a and 203b and the second chip component 204 are so-called chip components which are contrasted with packaged components in surface mounting technologies. Such chip components are generally electronic components having substantially rectangular-parallelepiped shapes or cylindrical shapes and including electrodes at their longitudinal opposite ends. Further, as other chip components, there are known multiple-component type (or network type) chip components constituted by a plurality of miniscule components.

As illustrated in FIG. 24, the secondary substrate 211 includes plural electrodes 2101 formed on one main surface and plural electrodes 2102 formed on the other main surface, namely on the surface opposite from the aforementioned main surface, and the secondary substrate 211 is a substrate (also referred to as an interposer) for electrically bonding the first chip components 203a and 203b to the second chip component 204. The electrodes 2101 and the electrodes 2102 are electrically connected to each other through electrode patterns, vias and the like which are not illustrated, wherein the connection therebetween is made in various manners depending on the circuits formed on the circuit board 201. The secondary substrate 211 is formed in a plate shape or a film shape from a resin or a ceramic such as a glass epoxy resin or polyimide resin, and the electrodes 2101 and 2102 are made of cupper, similarly to that of the substrate 202.

In FIGS. 23 and 24, the first chip components 203a and 203b are same-sized chip condensers having substantially a rectangular-parallelepiped shape and including electrodes 231 at their opposite ends and have a length of about 0.6 mm, a width of about 0.3 mm and a thickness (height) of about 0.3 mm, for example. Further, the electrodes 231 are bonded to the electrodes 223 on the substrate 202 through the solder 270a, so that the first chip components 203a and 203b are mounted on the substrate 202 through the solder 270a.

The first chip component 203a and the first chip components 203b are arranged in parallel to each other, namely the longitudinal directions of the chip components 203a and 203b are oriented in the same direction and the first chip component 203a and the first chip component 203b are arranged in the direction perpendicular to their longitudinal directions. Further, the chip components 203a and 203b have substantially the same height on the substrate 202. The fact that they have substantially the same height on the substrate 202 means that they have the same heights, if the height difference between the chip components caused by fabrication errors and mounting errors therein are neglected. The interval between the first chip component 203a and the first chip component 203b is set to, for example, about 0.2 mm.

The secondary substrate 211 is mounted through solder 270a on the first chip components 203a and 203b, namely on the sides of the first chip components 203a and 203b opposite from the substrate 202, and the electrodes 2101 are bonded to the electrodes 231 of the first chip components 203a and 203b through the solder 270a. Namely, the first chip components 203a and 203b exist between the substrate 202 and the secondary substrate 211 and are bonded to both the substrate 202 and the secondary substrate 211. In this case, the electronic components exist between the substrate 202 and the secondary substrate 211 are only the first chip components 203a and 203b.

The second chip component 204 is a component of a different type from the first chip components 203a and 203b and is a chip resistor having substantially a rectangular parallelepiped shape and including electrodes 241 at its opposite ends and a resistor 242 (see FIG. 23) between the electrodes 241. The second chip component 204 has substantially the same size as that of the first chip components 203a and 203b and has a length of about 0.6 mm, a width of about 0.3 mm and a thickness (height) of about 0.25 mm, for example. The second chip component 204 is mounted through the solder 270b on the secondary substrate 211, namely on the side of the secondary substrate 211 opposite from the first chip components 203a and 203b, and the electrodes 241 thereof are bonded to the electrodes 2102 on the secondary substrate 211 through the solder 270b.

The second chip component 204 is electrically connected at, for example, one electrode 241 to an electrode 231 of the first chip component 203a and is also electrically connected at the other electrode 241 to an electrode 231 of the first chip component 203b, through the electrodes 2101 and 2102, the wirings, the vias and the like on and in the secondary substrate 211. The two electrodes 231 which are not connected to the second chip component 204 are connected to each other. Also, the two electrodes may not be connected to each other, and, in this case, electrodes 2101 bonded to the two electrodes are dummy electrodes. Consequently, there is formed structure in which the first chip components 203a and 203b and the second chip component 204 are stacked in two stages perpendicularly to the surface of the substrate 202, through the secondary substrate 211 and the solder 270a, 270b and 270c, so that they are tri-dimensionally mounted thereon, wherein only the first chip components 203a and 203b are placed between the substrate 202 and the secondary substrate 211. Further, although not illustrated, other chip components, packaged electronic components and the like are mounted on the circuit board 201 around the first chip components 203a and 203b.

Figure 25:
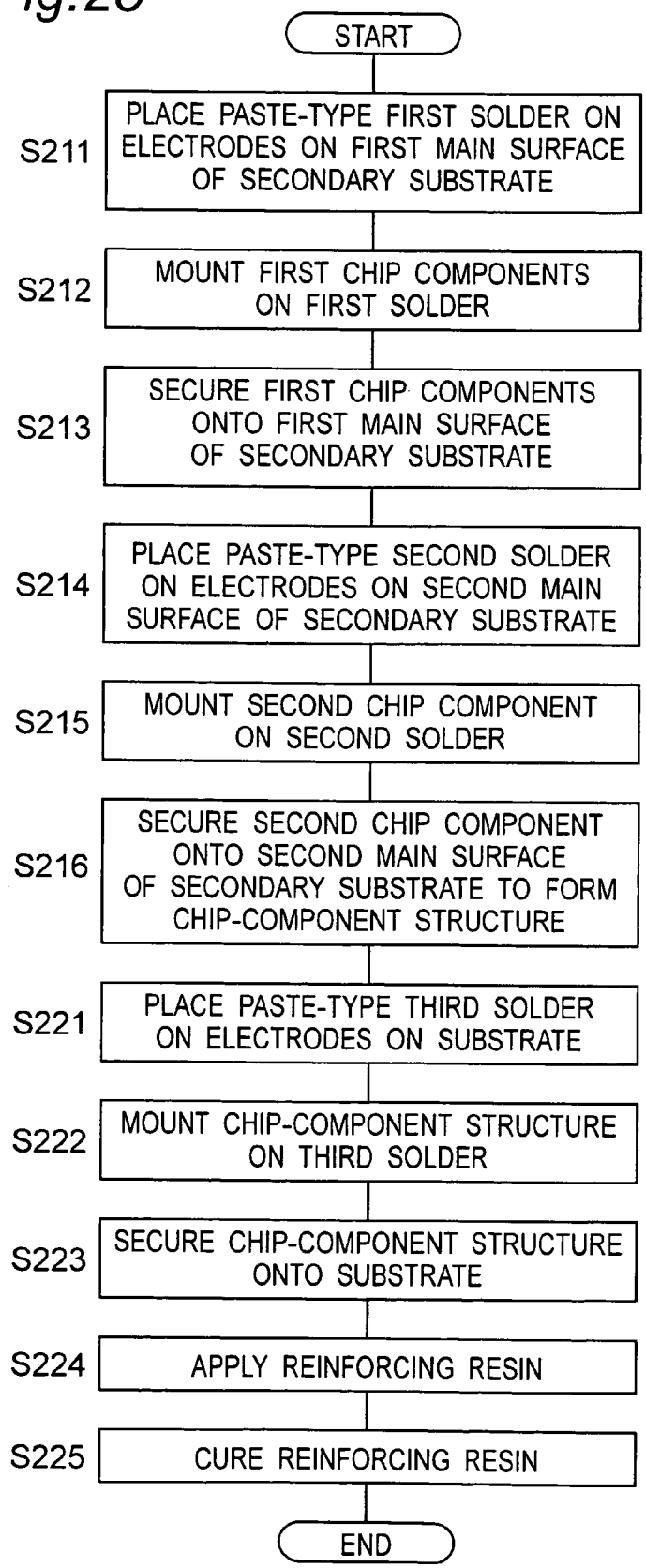
FIG. 25 is a flow chart illustrating a chip-component mounting method.

FIG. 25 is a flow chart illustrating a method for mounting chip components during the fabrication of the circuit board 201, in focusing on the mounting of the first chip components 203a and 203b, the secondary substrate 211 and the second chip component 204. Further, FIGS. 26A to 26E and FIGS. 27A to 27D are views illustrating the state of mounting of the first chip components 203a and 203b, the secondary substrate 211 and the second chip component 204. Hereinafter, there will be described a method for mounting chip components during the fabrication of the circuit board 201.

Figure 26A:
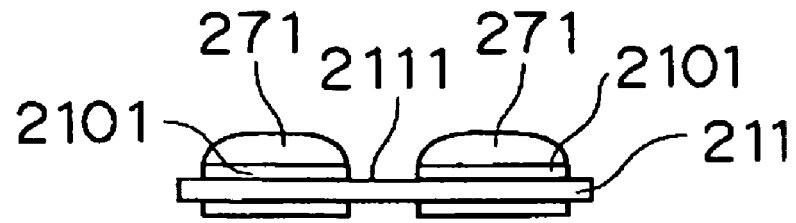
FIG. 26A is a view illustrating formation of a chip-component structure.
Figure 26B:
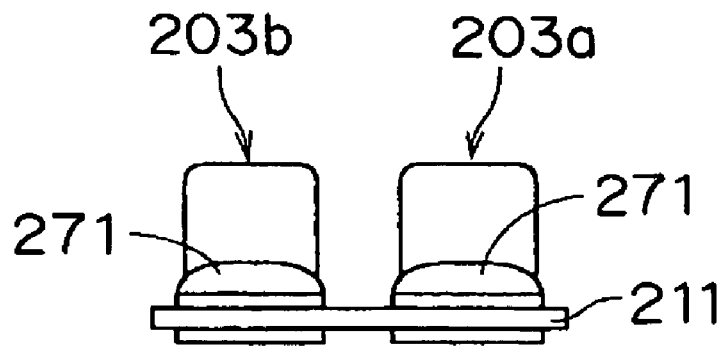
FIG. 26B is a view illustrating formation of the chip-component structure.

At first, as illustrated in FIG. 26A, paste-type solder (hereinafter, referred to as "first solder") 271 is placed on the respective electrodes 2101 on a main surface (hereinafter, referred to as "a first main surface") 211 of the secondary substrate 211, through screen printing (step S211). The first solder 271 is so-called cream solder, which is paste-type solder formed by mixing powder-type solder with viscous flux. Then, as illustrated in FIG. 26B, the first chip components 203a and 203b are mounted on the first solder 271 on the secondary substrate 211 (step S212).

Then, the secondary substrate 211 is transferred into the reflowing apparatus, and the first solder 271 is heated to be molten in the hot bath, which vaporizes the flux constituent while leaving only the solder constituent. Then, the first solder 271 is cooled down to be solidified into solid solder 270a spreading over the electrodes 231 of the first chip components 203a and 203b (see FIG. 26C which is a vertically reversed view), which causes the electrodes 231 of the first chip components 203a and 203b to be electrically connected and mechanically secured to the electrodes 2101 on the secondary substrate 211 (step S213).

Figure 26C:
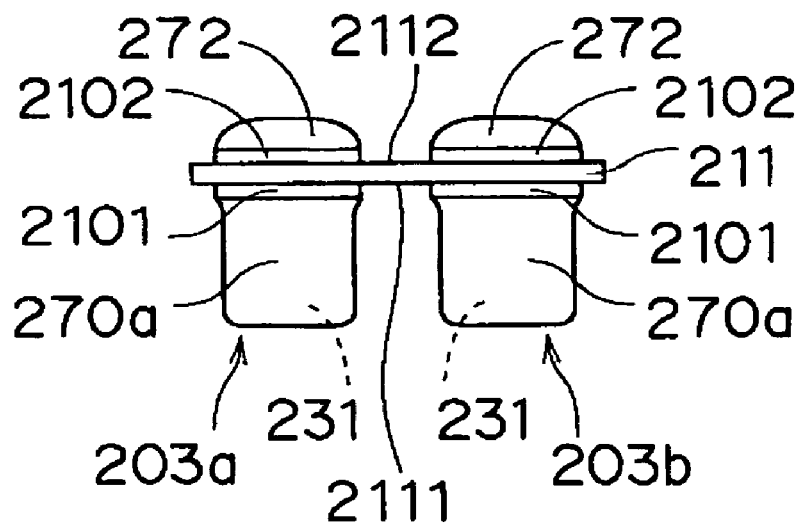
FIG. 26C is a view illustrating formation of the chip-component structure.
Figure 26D:
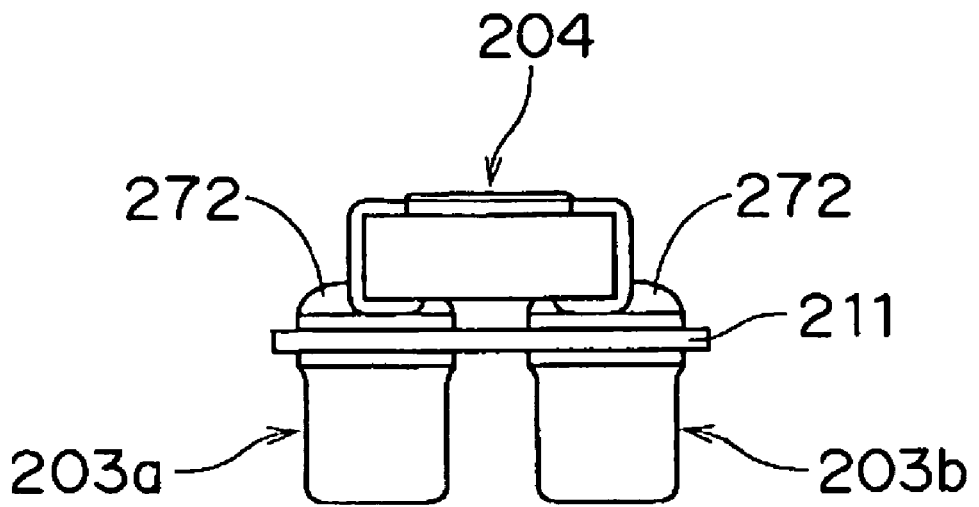
FIG. 26D is a view illustrating formation of the chip-component structure.

Next, as illustrated in FIG. 26C, the secondary substrate 211 on which the first chip components 203a and 203b have been secured is turned upside down, and then, paste-type cream solder (hereinafter, referred to as "second solder") 272 is placed on the respective electrodes 2102 on the main surface (hereinafter, referred to as "a second main surface) of the secondary substrate 211 opposite from the first main surface 2111, through screen printing or using a fine nozzle (step S214). Then, as illustrated in FIG. 26D, the second chip component 204 is mounted on the second solder 272 on the secondary substrate 211 (step S215).

Figure 26E:
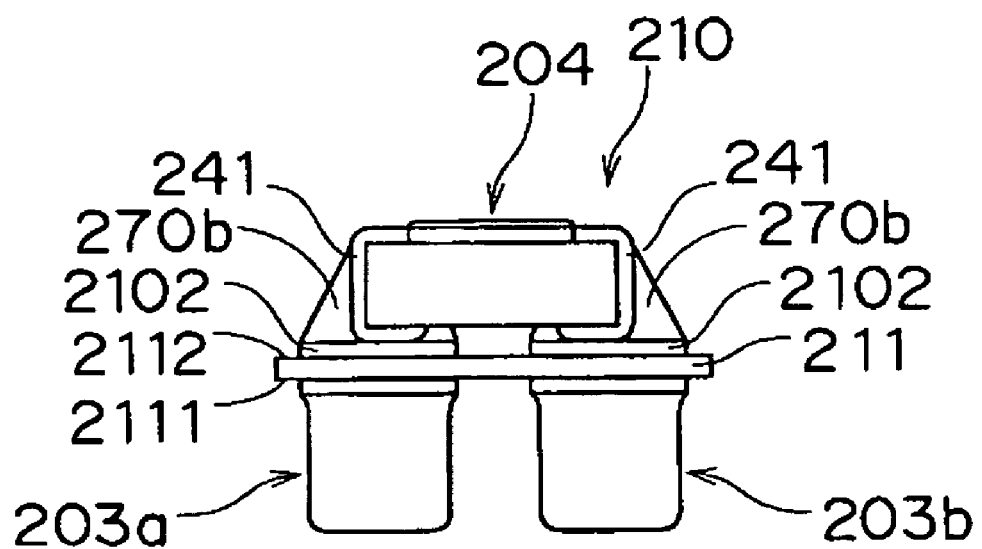
FIG. 26E is a view illustrating formation of the chip-component structure.

Then, the secondary substrate 211 is transferred into the reflowing apparatus, and the second solder 272 is heated to be molten in the hot bath and then is cooled down to be solidified into solid solder 270b, which causes the electrodes 241 of the second chip component 204 to be electrically connected and mechanically secured to the electrodes 2102 on the secondary substrate 211, as illustrated in FIG. 26E. Thus, chip-component structure 210 have been formed, wherein, in the chip-component structure 210, the first chip components 203a and 203b are secured on the first main surface 2111 of the secondary substrate 211 and second chip component 204 is secured on the second main surface 2112 of the secondary substrate 211 (step S216).

Figure 27A:
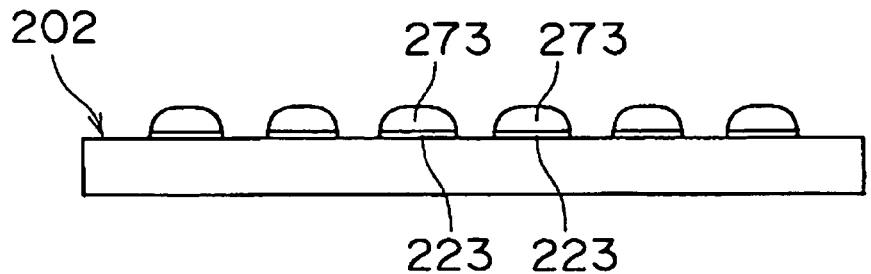
FIG. 27A is a view illustrating mounting of a chip-component structure.
Figure 27B:
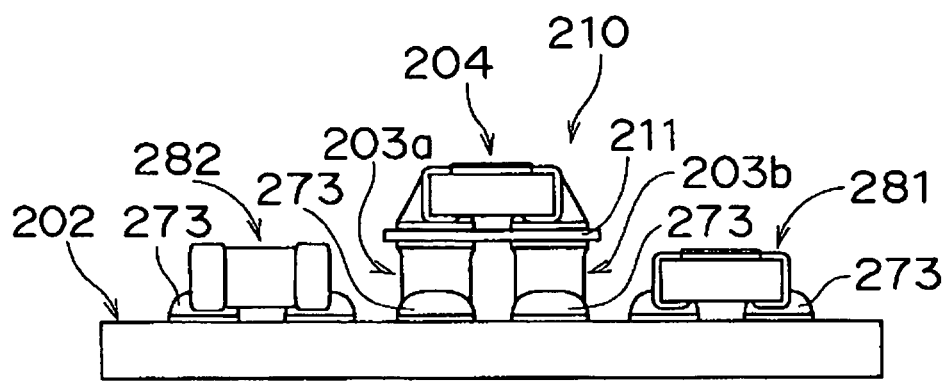
FIG. 27B is a view illustrating mounting of the chip-component structure.

Next, as illustrated in FIG. 27A, paste-type solder (hereinafter, referred to as "third solder") 273 is placed on the electrodes 223 on the substrate 202, through screen sprinting or using a fine nozzle (step S221). Subsequently, as illustrated in FIG. 27B, the chip-component structure 210 is mounted on the third solder 273 on the substrate 202 such that the first chip components 203a and 203b are faced to the substrate 202 (step S222). At this time, as required, other chip components 281 and 282, packaged electronic components (not illustrated) and the like are also mounted on the third solder 273, similarly to the chip-component structure 210. Further, the first chip component 203a and the first chip component 203b have substantially the same height on the secondary substrate 211 (which is also the height on the substrate 202), which enables stably stacking the chip-component structure 210 with the secondary substrate 211 placed horizontally.

Figure 27C:
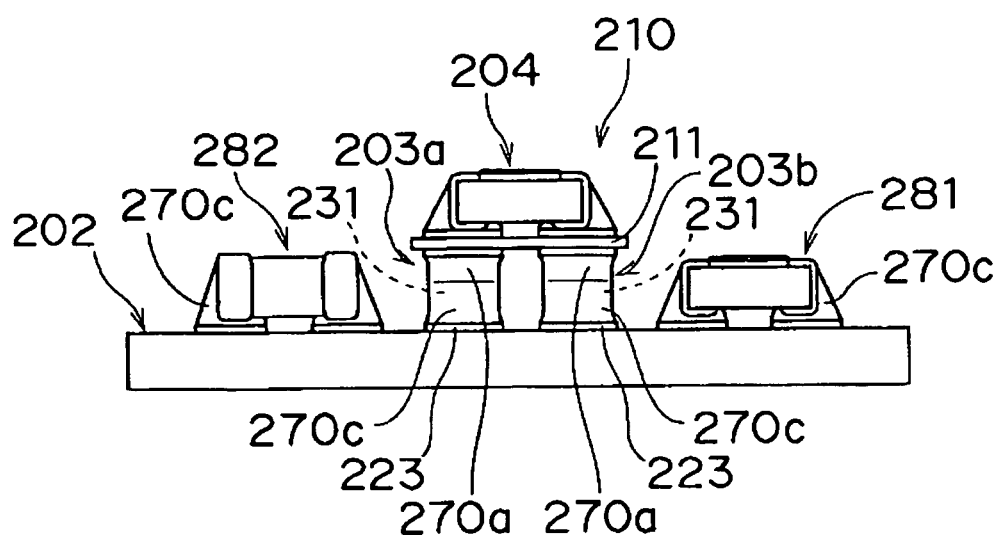
FIG. 27C is a view illustrating mounting of the chip-component structure.

Then, the substrate 202 is transferred into the reflowing apparatus, and then, the third solder 273 is heated to be molten in the hot bath and then is cooled down to be solidified into solid solder 270*c*, which causes the electrodes 231 of the first chip components 203*a* and 203*b* in the chip-component structure 210 to be electrically connected and mechanically secured to the electrodes 223 on the substrate 202, as illustrated in FIG. 27C (step S223). Thus, the chip-component structure 210 has been mounted on the substrate 202. The other chip components 281 and 282, the packaged electronic components (not illustrated) and the like are also mounted on the substrate 202, similarly to the chip-component structure 210.

Figure 27D:
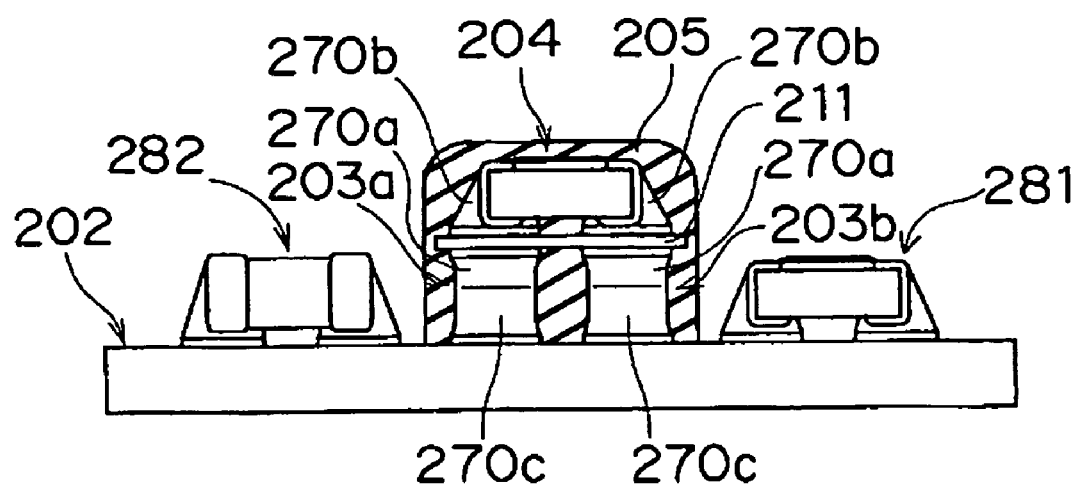
FIG. 27D is a view illustrating mounting of the chip-component structure.

Thereafter, as illustrated in FIG. 27D, a reinforcing resin 205 for reinforcing the junctions between electrodes is applied thereto using a nozzle, such that it covers the first chip components 203*a* and 203*b*, the secondary substrate 211 and the second chip component 4, or it covers either only the under fill or at least the junctions between electrodes (step S224). Thereafter, the reinforcing resin 205 is cured (step S225). Further, the reinforcing resin 205 may be a resin which is cured by light or heat or a resin which is naturally cured. This can reinforce the structure constituted by the first chip components 203*a* and 203*b*, the secondary substrate 211 and the second chip component 204, thereby improving the reliability of the circuit board 201.

Through the aforementioned processes, the mounting of the chip components has been completed, and thus, the circuit board 201 has been provided, wherein the circuit board 201 includes the first chip components 203*a* and 203*b* mounted on the substrate 202 through the solder 270*c*, the secondary substrate 211 mounted on the first chip components 203*a* and 203*b* through the solder 270*a* continuous with the solder 270*c*, the second chip component 204 mounted on the secondary substrate 211 through the solder 270*b*, and the reinforcing resin 205 which reinforces the first chip components 203*a* and 203*b*, the secondary substrate 211 and the second chip component 204 (see FIG. 23, FIG. 24 and FIG. 27D).

Further, during melding the second solder 272, the solder 270*a* which has been solidified may be molten again. However, if such re-melting is not desirable, second solder 272 having a melting point lower than the re-melting temperature of the solder 270*a*, namely the first solder 271, is employed, and the temperature of the second reflowing is set to a temperature which can melt the second solder 272 while preventing the solder 270*a* from being re-molten. Similarly, during melding the third solder 273, the solder 270*a* and 270*b* which has been solidified may be molten again. However, if such re-melting is not desirable, third solder 273 having a melting point lower than the re-melting temperature of the solder 270*a* and 270*b*, namely the first solder 271 and the second solder 272, is employed, and the temperature of the third reflowing is set to a temperature which can melt the third solder 273 while preventing the solder 270*a* and 270*b* from being re-molten.

Also, when mounting the chip-component structure 210 onto the substrate 202, it is possible to locally heat only a small region including the chip-component structure 210, using hot air or light. This enables mounting the first chip components 203*a* and 203*b*, the secondary substrate 211 and the second chip component 204 while suppressing the influences on the other region.

Figure 28:
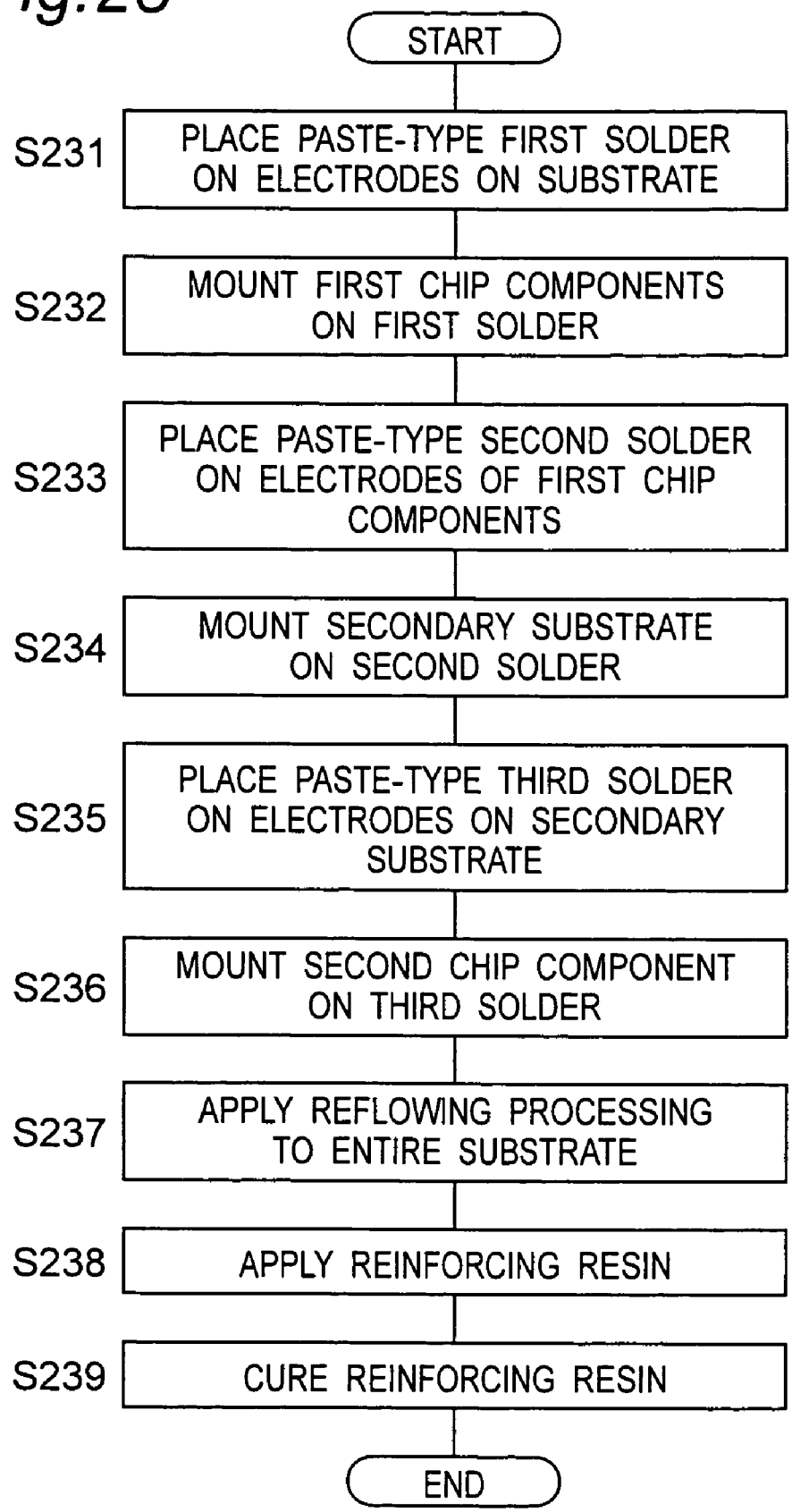
FIG. 28 is a flow chart illustrating another chip-component mounting method.

FIG. 28 is a flow chart illustrating another method for mounting chip components during the fabrication of the circuit board 201, in focusing on the mounting of the first chip components 203*a* and 203*b*, the secondary substrate 211 and the second chip component 204. Further, FIGS. 29A to 29E are views illustrating the state of mounting of the first chip components 203*a* and 203*b*, the secondary substrate 211 and the second chip component 204.

Figure 29A:
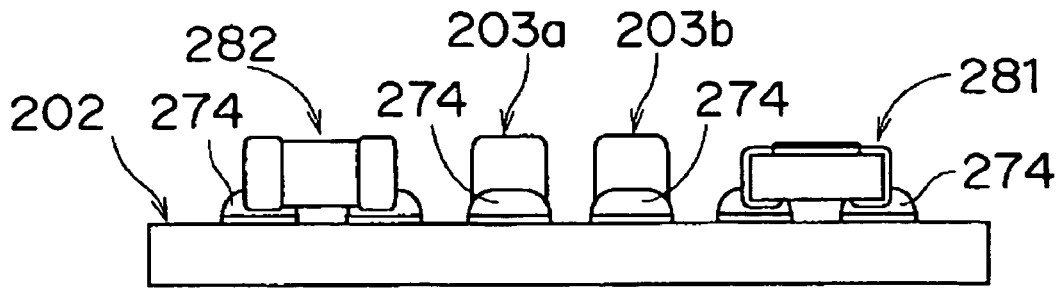
FIG. 29A is a view illustrating mounting of first and second chip components.

According to the method for mounting chip components illustrated in FIG. 28, at first, similarly to in FIG. 27A, paste-type solder (hereinafter, referred to as "first solder") 274 (a reference character of 274 is substituted for the reference character 273 in FIG. 27A) is placed on the respective electrodes 223 on the substrate 202, through screen printing (step S231). Subsequently, as illustrated in FIG. 29A, the first chip components 203*a* and 203*b* are mounted on the first solder 274 on the substrate 202 (step S232). At this time, as required, other chip components 281 and 282, packaged electronic components (not illustrated) and the like are also mounted on the first solder 274, similarly to the first chip components 203*a* and 203*b*.

Figure 29B:
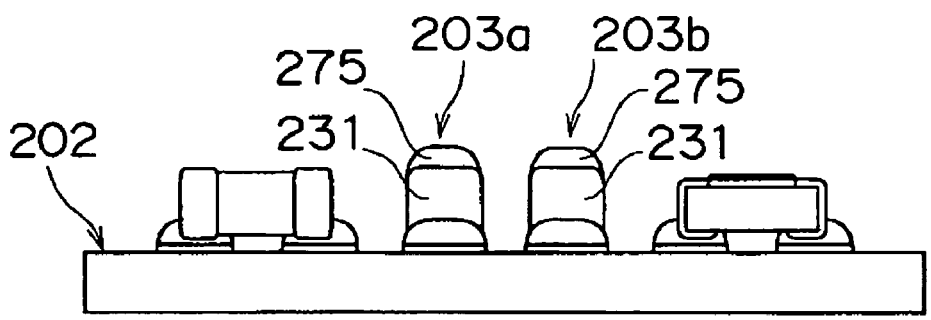
FIG. 29B is a view illustrating mounting of the first and second chip components.
Figure 29C:
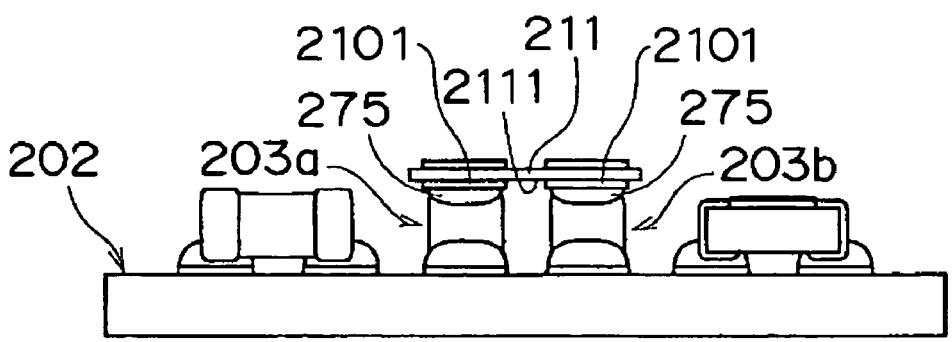
FIG. 29C is a view illustrating mounting of the first and second chip components.

Next, as illustrated in FIG. 29B, paste-type solder (hereinafter, referred to as "second solder") 275 is placed on the electrodes 231 of the first chip components 203*a* and 203*b* through screen printing or using a fine nozzle (step S233). Then, as illustrated in FIG. 29C, the secondary substrate 211 is mounted on the second solder 275 on the first chip components 203*a* and 203*b* (step S234). At this time, the secondary substrate 211 is mounted thereon such that the respective electrodes 2101 on the first main surface 2111 are positioned on the second solder 275. Further, the first chip component 203*a* and the first chip component 203*b* have substantially the same height on the substrate 202, which enables stably stacking the secondary substrate 211 on the first chip components 203*a* and 203*b*.

Figure 29D:
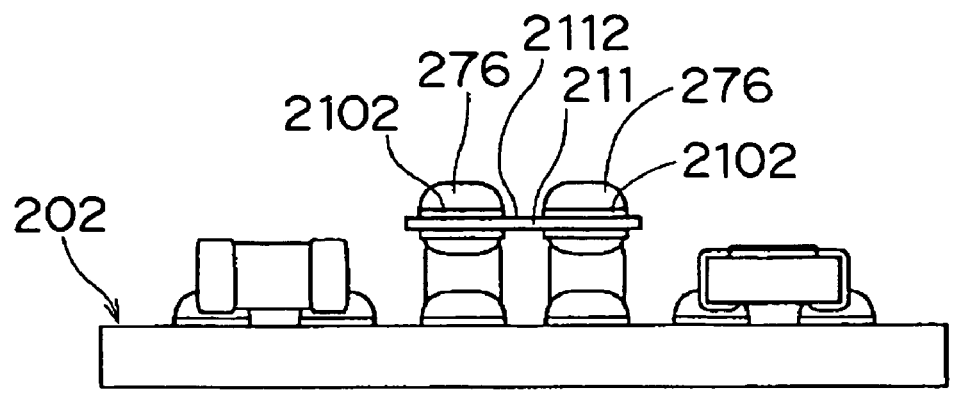
FIG. 29D is a view illustrating mounting of the first and second chip components.
Figure 29E:
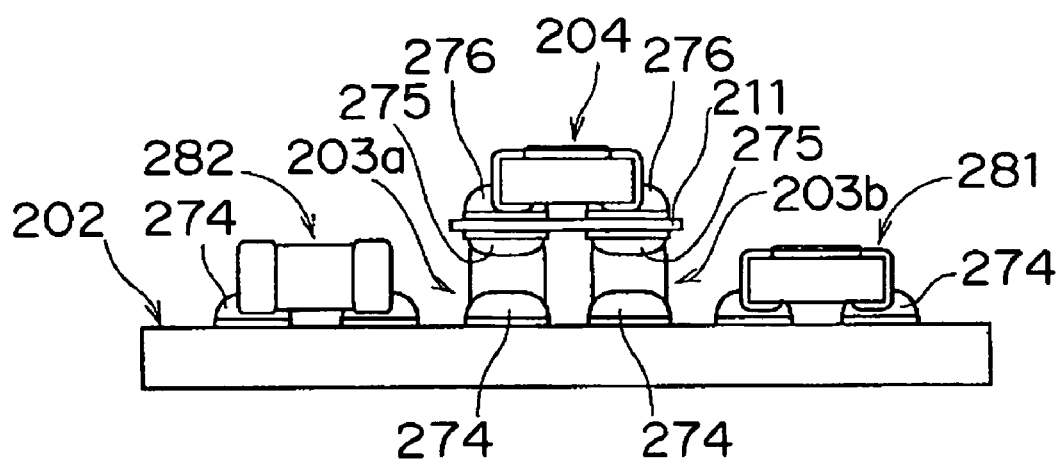
FIG. 29E is a view illustrating mounting of the first and second chip components.

Next, as illustrated in FIG. 29D, paste-type solder (hereinafter, referred to as "third solder") 276 is placed on the respective electrodes 2102 on the second main surface 2112 of the secondary substrate 211 through screen printing or using a fine nozzle (step S235). Then, as illustrated in FIG. 29E, the second chip component 204 is mounted on the third solder 276 on the secondary substrate 211 (step S236).

The substrate 202 is transferred into the reflowing apparatus, and reflowing processing is applied to the entire substrate 202 (step S237). Namely, the first solder 274, the second solder 275 and the third solder 276 are concurrently heated to be molten in the hot bath and then are cooled down to be solidified. This results in structure similar to that illustrated in FIG. 27C and FIG. 24. Namely, as illustrated in FIG. 24, the first solder 274 is changed to solid solder 270*c* to cause the electrodes 231 of the first chip components 203*a* and 203*b* to be electrically connected and mechanically secured to the electrodes 223 on the substrate 202, the second solder 275 is changed to solid solder 270*a* to cause the electrodes 2101 on the secondary substrate 211 to be electrically connected and mechanically secured to the electrodes 231 of the first chip components 203*a* and 203*b*, and the third solder 276 is changed to solid solder 270*b* to cause the electrodes 241 of the second chip component 204 to be electrically connected and mechanically secured to the electrodes 2102 on the secondary substrate 211. As illustrated in FIGS. 29E and 27C, other chip components 281 and 282, packaged electronic components (not illustrated) and the like are also mounted on the substrate 202, since the first solder 274 is changed to solid solder 270*c*.

Thereafter, as illustrated in FIG. 27D, a reinforcing resin 205 for reinforcing the junctions between electrodes is applied thereto, such that it covers the first chip components 203*a* and 203*b*, the secondary substrate 211 and the second chip component 204 (step S238) Thereafter, the reinforcing resin 205 is cured (step S239).

Through the aforementioned processes, a circuit board 201 can be provided, wherein the circuit board 201 includes the first chip components 203a and 203b, the secondary substrate 211 and the second chip component 204 which are mounted in this order on the substrate 202 (see FIG. 23, FIG. 24 and FIG. 27D). According to the mounting method illustrated in FIG. 28, the securing of the first chip components 203a and 203b onto the substrate 202, the securing of the secondary substrate 211 onto the first chip components 203a and 203b and the securing of the second chip component 204 onto the secondary substrate 211 are concurrently performed, which enables performing the mounting operation with higher efficiency.

Also, it is possible to separately perform the securing of the first chip components 203a and 203b onto the substrate 202, the securing of the secondary substrate 211 onto the first chip components 203a and 203b and the securing of the second chip component 204 onto the secondary substrate 211. Namely, reflowing may be performed every time the first solder 274, the second solder 275 or the third solder 276 has been coated or may be concurrently performed on only two of them.

There have been described the structure of the circuit board 201 and methods for mounting chip components, wherein the second chip component 204 is mounted on the first chip components 203a and 203b in the circuit board 201, so that they are tri-dimensionally mounted therein. This enables effectively utilizing the space usable for mounting, which enables mounting chip components on the substrate 202 with a higher density, thereby enabling reduction of the size of the circuit board 201.

Figure 30A:
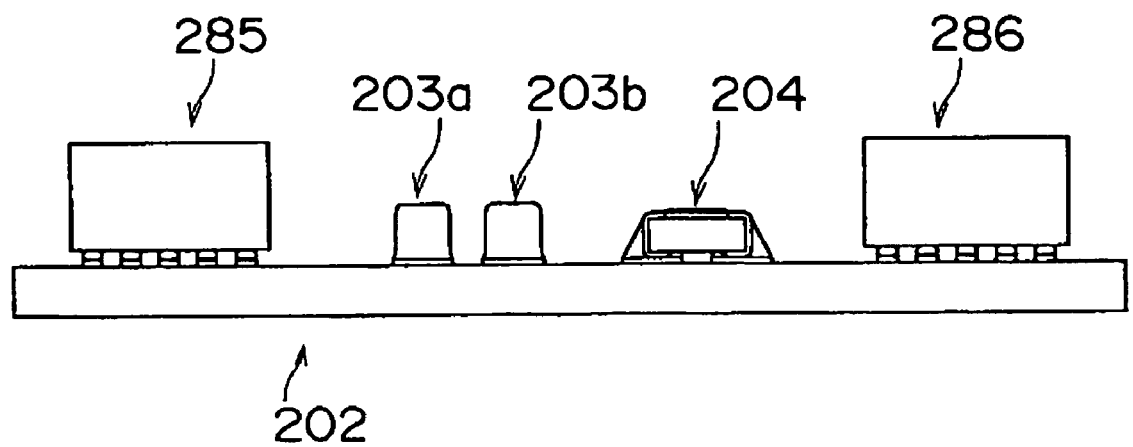
FIG. 30A is a view illustrating chip components which are not stacked.
Figure 30B:
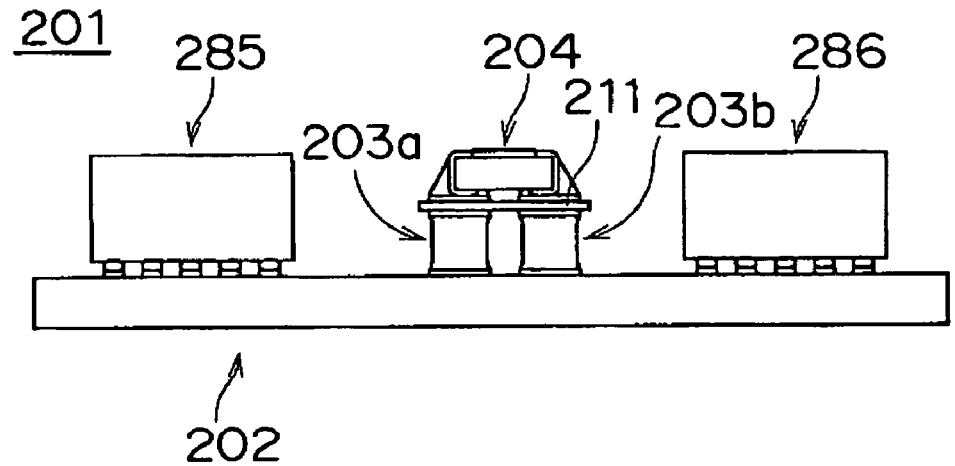
FIG. 30B is a view illustrating chip components which are stacked.

For example, when the first chip components 203a and 203b, the second chip component 204 and other packaged electronic components 285 and 286 are mounted on the substrate 202 as illustrated in FIG. 30A, there is left a space above the first chip components 203a and 203b and the second chip component 204, which increases a region required for mounting them. On the other hand, when the second chip component 204 is mounted on the first chip components 203a and 203b with the secondary substrate 211 interposed therebetween as in the circuit board 201 illustrated in FIG. 30B, the height of the upper surface of the second chip component 204 falls substantially equal to the heights of the packaged electronic components 285 and 286, which enables effectively utilizing the space above the substrate 202 to mount chip components with a higher density, thereby enabling reduction of the area of the circuit board 201 without largely increasing the thickness of the circuit board 201.

Further, in the circuit board 201, the second chip component 204 is mounted on the first chip components 203a and 203b with the secondary substrate 211 interposed therebetween, which enables diversifying the connection between the first chip components and the second chip component with the electrode patterns on the secondary substrate 211 and the placement of the second chip component 204, thereby increasing the degree of flexibility of the circuit design.

Further, between the substrate 202 and the secondary substrate 211, there are placed only the first chip components 203a and 203b which are bonded to both the substrate 202 and the secondary substrate 211, which can save the size of the secondary substrate 211 to a minimum necessary size, thereby improving the durability of the circuit board against bending and the strength of the circuit board against external force per unit area, in comparison with cases where a large separate substrate is laminated on a substrate as in the prior art. This can enhance the reliability of the circuit board 201. Furthermore, plural layers are formed within a significantly small region of the circuit board 201, which enables locally and simply changing the design at plural positions on the circuit board 201. This results in realization of high-density mounting of chip components while suppressing the increase of the designing cost of the circuit board 201.

FIGS. 31 to 35 are views illustrating another exemplary circuit boards 201 including chip components stacked on substrates 202, wherein the circuit boards 201 are illustrated in three directions, similarly to in FIG. 24, and in each figures, a front view, a plan view and a side view are illustrated in the lower-left portion, the upper-left portion and the lower-right portion, respectively. In these figures, the contours of a secondary substrate 211 and solder 270a, 270b and 270c are illustrated by broken lines and electrodes on the secondary substrate 211 are not illustrated. In FIGS. 31 to 34, the solder 270b is not illustrated in the lower-right view, the solder 270a and 270c is not illustrated in the lower-left view, and the solder 270a, 270b and 270c and the electrodes on the substrate 202 are not illustrated in the upper-left view. Further, the stacked chip components are covered with a reinforcing resin, as required.

Figure 31:
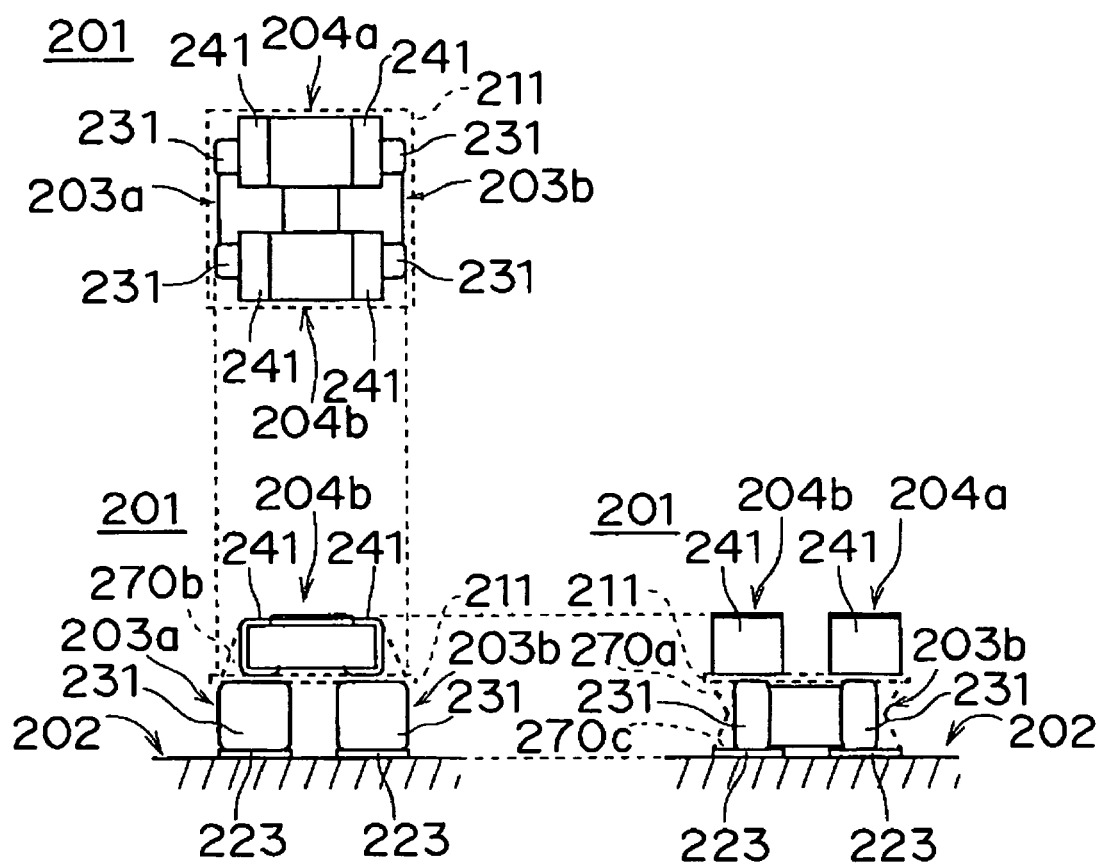
FIG. 31 is a view illustrating another exemplary structure on a circuit board.

In the circuit board 201 illustrated in FIG. 31, two first chip components 203a and 203b and two second chip components 4a and 4b are stacked in two stages perpendicularly to the surface of the substrate 202 with the secondary substrate 211 interposed therebetween so that they are tri-dimensionally mounted thereon in a bridge shape. In the example illustrated in FIG. 31, the first chip components 203a and 203b are chip condensers and the second chip components 204a and 204b are chip resistors. The circuit board 201 of FIG. 31 is the same as that of FIG. 24 except that two second chip components 204a and 204b are provided, and the same structures are designated by the same reference characters (this applies to FIGS. 32 to 35). Further, it is possible to arbitrarily determine the connection between the electrodes 231 of the first chip components 203a and 203b and the electrodes 241 of the second chip components 204a and 204b with the wirings, vias and the like on and in the secondary substrate 211, which enables flexibly addressing the change in the circuit design.

Figure 32:
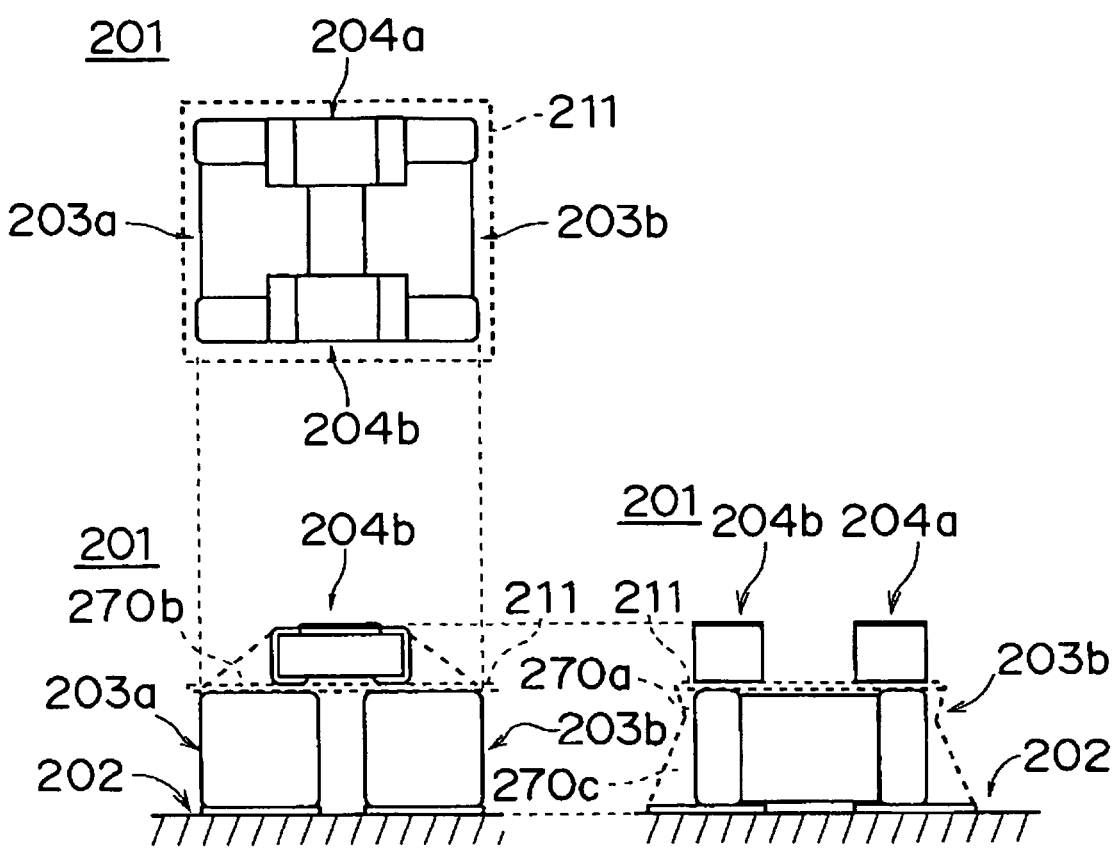
FIG. 32 is a view illustrating further a different exemplary structure on a circuit board.

The circuit board 201 illustrated in FIG. 32 is the same as that of FIG. 31 except that the two first chip components 203a and 203b are greater than the second chip components 204a and 204b relatively. Provided that the first chip components have substantially the same height as described above, the first chip components and the second chip components may have various sizes.

Figure 33:
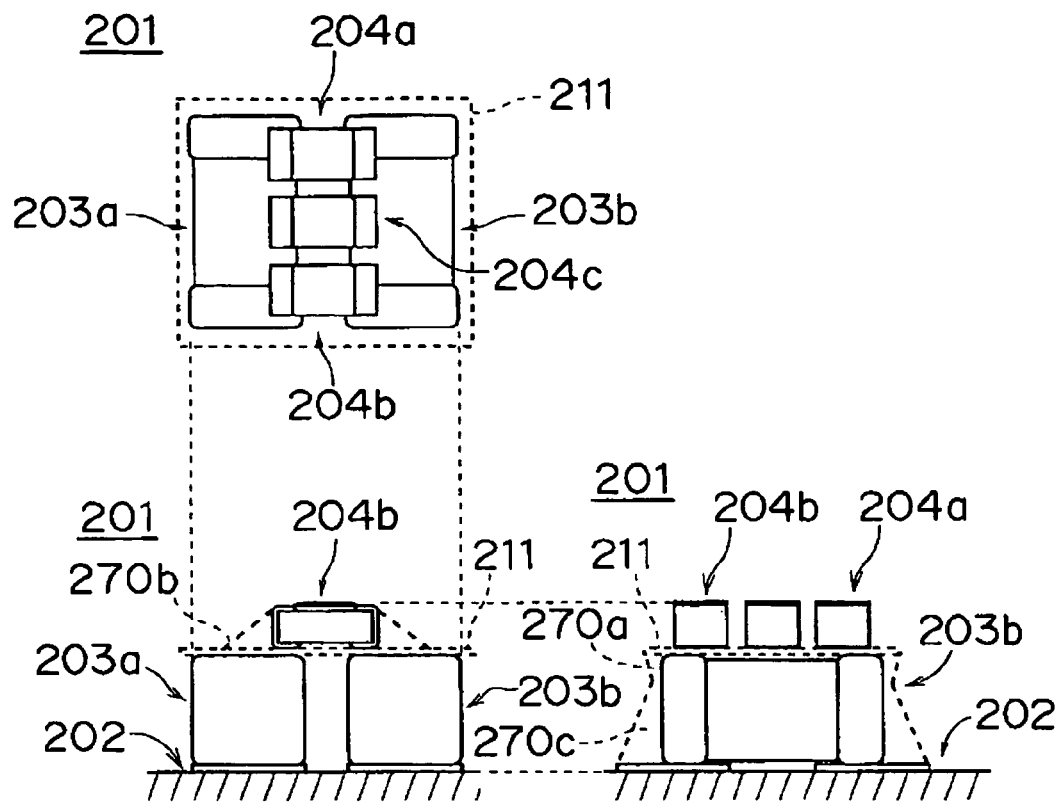
FIG. 33 is a view illustrating further a different exemplary structure on a circuit board.
Figure 34:
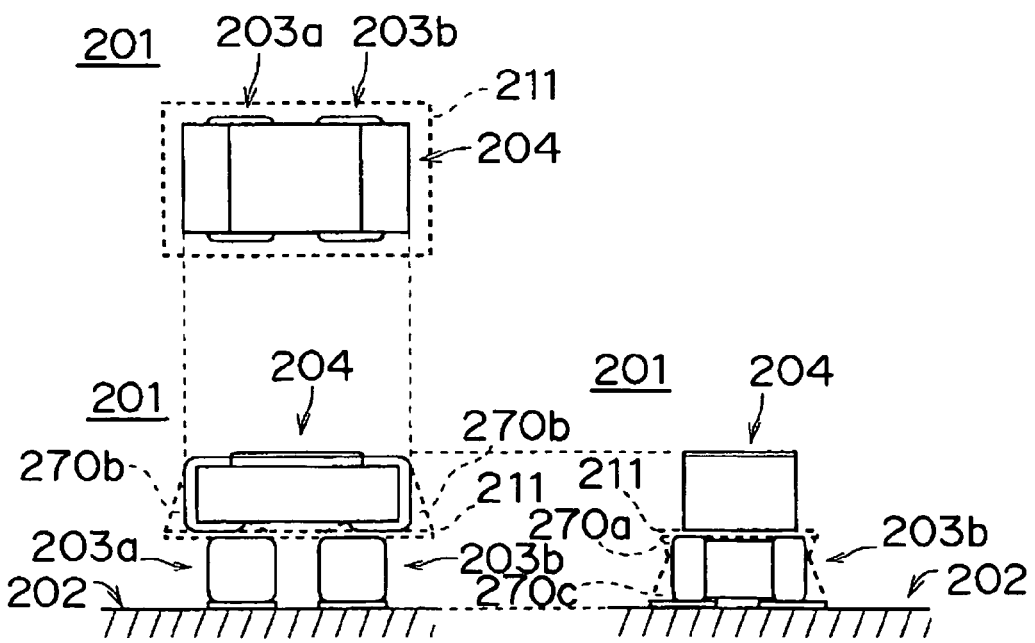
FIG. 34 is a view illustrating further a different exemplary structure on a circuit board.

In the circuit board 201 illustrated in FIG. 33, two first chip components 203a and 203b and three second chip components 204a, 204b and 204c are stacked in two stages perpendicularly to the surface of the substrate 202 with a secondary substrate 211 interposed therebetween so that they are tri-dimensionally mounted thereon. The circuit board 201 illustrated in FIG. 33 is the same as that of FIG. 32 except that three second chip components are provided. On the other hand, in the circuit board 201 illustrated in FIG. 34, a secondary substrate 211 is mounted on two first chip components 203a and 203b, and a single large second component 204 is mounted on the secondary substrate 211. As described above, a single second chip component or three or more second chip components may be provided. Further, second chip components may be arranged in two rows. Further, second chip components may be oriented such that they are parallel to first chip components.

Figure 35:
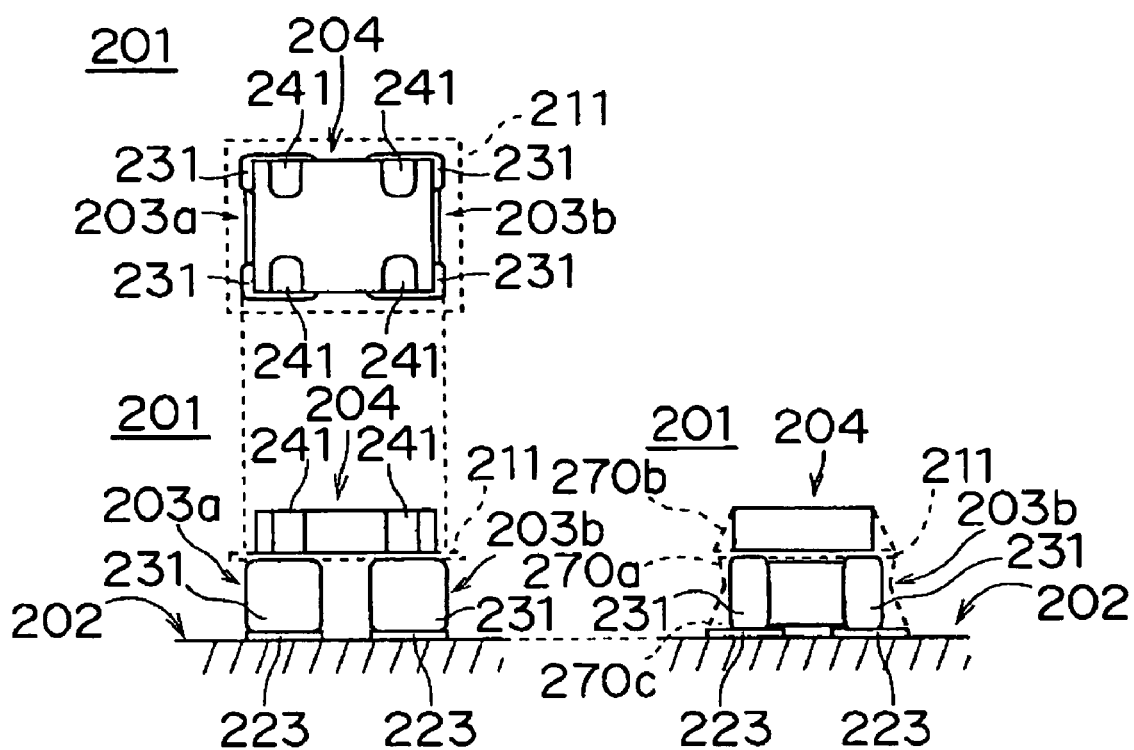
FIG. 35 is a view illustrating further a different exemplary structure on a circuit board.

In the circuit board 201 illustrated in FIG. 35, a multiple-component type chip component is employed as a second chip component 204. In FIG. 35, there is exemplified a second chip component 204 having four electrodes 241. Further, in FIG. 35, solder 270a, 270b and 270c is not illustrated in the lower-left view, and the solder 270a, 270b and 270c and the electrodes on the substrate 202 are not illustrated in the upper-left view. The placement of the first chip components 203a and 203b and the secondary substrate 211 is the same as that in FIG. 24. The first chip components 203a and 203b are bonded at their electrodes 231 to the electrodes 223 on the substrate 202 through the solder 270c, and the secondary substrate 211 is mounted on the first chip components 203a and 203b through the solder 270a. The second chip component 204 is mounted on the secondary substrate 211 through the solder 270b and also is electrically connected at its respective electrodes 241 to the electrodes 231 of the two first chip components 203a and 203b, for example, through the wirings on the secondary substrate 211. As described above, multiple-component type chip components may be employed, and the number of electrodes of the chip component is not limited to two. Further, the first chip component may be a multiple-component type chip component.

Any of the circuit boards 201 illustrated in FIGS. 31 to 35 can be fabricated according to the method illustrated in FIG. 25 or 28. Further, by mounting first and second chip components such that the second chip component is stacked on the first chip components perpendicularly to the substrate 202 with the secondary substrate 211 interposed therebetween, it is possible to effectively utilize the space usable of mounting, thereby enabling reduction of the size of the circuit board 201, similarly to the circuit board 201 illustrated in FIG. 23 and FIG. 24. Further, by stacking different types of components, namely by making functions in a first chip component included in at least a single first chip component mounted on the substrate 202 and in a second chip component connected to an electrode of the first chip component differ, it is possible to flexibly and locally realize tri-dimensionality of the circuit structure, thereby realizing significant reduction of the size of the circuit board 201.

Although there have been described embodiments of the present invention, the present invention is not limited to the aforementioned embodiments and various changes can be made thereto.

While the first chip components mounted on the substrate 202 and the second chip component mounted on the first chip components with the secondary substrate interposed therebetween are generally chip resistors, chip condensers or chip inductors, they may be either chip components having other functions or multiple-component type chip components such as multiple-component type chip resistors, chip-type networks, as described above. Such multiple-component type chip components may be components constituted by the same type of chip components connected to one another or different types of chip components connected to one another. Further, such multiple-component type chip components do not always have electrodes at their longitudinal end portions. Also, it is possible to employ chip components having shapes different from substantially rectangular-parallelepiped shapes, such as MELF resistors and cylindrical chip resistors.

The first chip components and the second chip component may have various sizes. In general, a plurality of fine chip components having lengths of 2 mm or less are mounted on a single substrate, and such chip components generally have heights of 1 mm or less and have no influences on the height of the circuit board when they are stacked in only two stages. Therefore, it is desirable to stack fine chip components having lengths of 2 mm or less.

While the first chip components, the secondary substrate 211 and the second chip component are mounted through the paste-type solder in the aforementioned embodiments, it is also possible to form solder layers on the substrate 202, the first chip components, the secondary substrate 211 or the second chip component by pre-coating through plating, dipping or the like and mount them using the solder layers. By performing such mounting, it is possible to simplify the operations for fabricating the circuit board 201. Also, it is possible to mount the first chip components, the secondary substrate 211 or the second chip component through other conductive bonding materials, such as silver paste and conductive resins. Also, it is possible to concurrently perform the mounting and the securing of chip components, such as the case of using a thermosetting adhesive resin. In this case, the mounting of the chip components is completed at the time when they have been mounted.

Three or more first chip components and three or more second chip components may be provided, and these chip components may be placed in various manners. Namely, plural first chip components are mounted on a substrate 202 and at least a single second chip component is mounted on the first chip components with a secondary substrate interposed therebetween, wherein only the first chip components exist as electronic components between the substrate 202 and the secondary substrate 211, thereby realizing flexible and local multi-layer structure.

In particular, by providing two first chip components, it is possible to easily and partially realize tri-dimensional circuit structure at many positions, which enables realization of tri-dimensional circuit structure with a highest efficiency, thereby realizing high-density mounting of chip components. Furthermore, by providing two first chip components, it is possible to minimize the distortion of the secondary substrate 211 with respect to the distortion of the circuit board 201, thereby improving the reliability of the circuit board 201.

Also, it is possible to provide, on the circuit board 201, structure constituted by chip components stacked in three or more stages with plural secondary substrates interposed therebetween, as well as structure constituted by first chip components and second chip components stacked in two stages.

Further, by properly combining arbitrary embodiments out of the aforementioned embodiments, it is possible to offer the effects of the respective embodiments.

While the present invention has been sufficiently described with respect to preferred embodiments with reference to the accompanying drawings, various changes and modifications will be apparent to those skilled in the art. Such changes and modifications are to be understood as included within the scope of the present invention as defined by the appended claims unless they depart therefrom.

INDUSTRIAL APPLICABILITY

The present invention is applicable to techniques for mounting chip components onto a substrate including electrode patterns formed thereon.

The invention claimed is:

1. A circuit board including chip components mounted thereon, the circuit board comprising:
   a substrate including electrode patterns formed thereon;
   plural first chip components having a first side and a second side opposite the first side, the first side mounted through conductive bonding material on said substrate, said plural first chip components included in said chip components and including a first chip component and a second chip component;
   a third chip component having a first electrode and a second electrode, and which is included in said chip components, said third chip component being mounted by solder on said second side of said plural first chip components; and a reinforcing resin configured to cover junctions between said plural first chip components and said third chip component on said substrate;

wherein said first chip component and said second chip component have substantially a same height on said substrate, and said third chip component is bonded by said first electrode coming into direct contact with an electrode of said first chip component and is bonded by said second electrode coming into direct contact with an electrode of said second chip component such that a longitudinal axis of said third chip component is arranged orthogonally to a longitudinal axis of each of said first chip component and said second chip component, and said plural first chip components and said third chip component are passive devices.

2. The circuit board according to claim 1, wherein each of said plural first chip components and said third chip component have lengths of 2 mm or less.

3. The circuit board according to claim 1, wherein each of said plural first chip components and said third chip component are resistors, condensers or inductors.

4. A circuit board including chip components mounted thereon, the circuit board comprising:

a substrate including electrode patterns formed thereon;

first chip components which are included in said chip components and mounted through a conductive bonding material on said substrate, said first chip components including a first chip component;

a second chip component which is included in said chip components and mounted by solder on a side of said first chip components opposite from said substrate; and a reinforcing resin configured to cover junctions between said first chip components and said second chip component on said substrate;

wherein said first chip component included in said first chip components is a component of a different type from said second chip component, and said second chip component is bonded by coming into direct contact with an electrode of said first chip component such that a longitudinal axis of said second chip component is arranged orthogonally to a longitudinal axis of said first chip component.

* * * * *